(12) United States Patent
Shimizu et al.

(10) Patent No.: US 6,628,559 B2
(45) Date of Patent: Sep. 30, 2003

(54) SEMICONDUCTOR MEMORY DEVICE HAVING REFRESHING FUNCTION

(75) Inventors: Tadayuki Shimizu, Hyogo (JP); Masaki Tsukude, Hyogo (JP); Minoru Senda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/971,694

(22) Filed: Oct. 9, 2001

(65) Prior Publication Data

US 2002/0149985 A1 Oct. 17, 2002

(30) Foreign Application Priority Data

Apr. 13, 2001 (JP) .......................... 2001-115457

(51) Int. Cl.[7] .................................. G11C 7/00
(52) U.S. Cl. .................. 365/222; 365/233; 365/226
(58) Field of Search ................. 365/222, 194, 365/198, 239, 233, 226

(56) References Cited

U.S. PATENT DOCUMENTS 5,315,557 A * 5/1994 Kim et al. .............. 365/222
6,222,785 B1 * 4/2001 Leung ..................... 367/11
6,434,076 B1 * 8/2002 Andersen et al. ........ 365/222
2001/0008496 A1 * 7/2001 Leung ..................... 365/223

FOREIGN PATENT DOCUMENTS

| JP | 3-203089 | 9/1991 |
| JP | 4-364295 | 12/1992 |
| JP | 2000-149550 | 5/2000 |

* cited by examiner

*Primary Examiner*—Thong Le
(74) *Attorney, Agent, or Firm*—McDermott, Will & Emery

(57) ABSTRACT

The semiconductor memory device of the invention has a refresh timer for generating a refresh clock, a refresh executing circuit for sequentially refreshing a plurality of memory cells part by part on the basis of the cycle of the refresh clock, and a refreshing control circuit disposed between the refresh timer and the refresh executing circuit, for stopping transmission of the refresh clock from the refresh timer to the refresh executing circuit in a predetermined period during which the cycle of the refresh clock is easy to become unstable. With the configuration, an erroneous operation of the refresh executing circuit can be prevented.

19 Claims, 20 Drawing Sheets

SEMICONDUCTOR MEMORY DEVICE HAVING REFRESHING FUNCTION

BACKGROUND OF THE INVENTION

1. Field of the Invention

The present invention relates to a semiconductor memory device and, more particularly, to a circuit configuration of a refreshing control circuit of a DRAM (Dynamic Random Access Memory) with a complete hidden refreshing function.

2. Description of the Background Art

Information stored in a DRAM with a complete hidden refreshing function is held by accumulating charges in a capacitor provided in a memory cell.

To prevent the stored information from being destroyed by a leak current, it is therefore necessary to periodically perform what is called a refreshing operation. The refreshing operation is performed by sequentially selecting word lines provided for rows of memory cells, reading and amplifying micro signals stored in all the memory cells on a selected word line, and executing rewriting. Even if the voltage of a storage node in a memory cell drops due to a leak current or the like, it is reproduced to an initial value.

By continuously sequentially selecting all the word lines, information stored in all the memory cells is reproduced, and storage information of the entire chip is held.

When the maximum refresh interval at which data of all the memory cells can be guaranteed is set as "trefmx" and "n" denotes the number of word lines, to refresh the word lines in refresh cycles tcrf at regular intervals so as to prevent stored information from being destroyed by a leak current or the like, $tcrf \leq trefmx/n$ has to be set.

FIG. 21 is a block diagram of a row selection control circuit 2000 for performing a conventional refreshing control included in a row decoder.

Row selection control circuit 2000 has a refresh timer 100, a refresh address generating circuit 200, and an internal address generating circuit 300.

Refresh timer 100 is a circuit for generating a refresh clock signal RCLK for specifying a cycle tcrf of executing the refreshing operation.

Refresh address generating circuit 200 is a circuit for receiving refresh clock signal RCLK, generating a refresh address in the refreshing operation, and outputting the refresh address to internal address generating circuit 300. In the refreshing operation, synchronously with refresh clock signal RCLK, counting of a row address for refreshing or the like is performed.

Internal address generating circuit 300 selects either an external address as an input signal or the refresh address and generates an internal address to designate a row address in a memory cell array.

To normally execute the refreshing operation, refresh timer 100 therefore has to oscillate refresh clock signal RCLK at a predetermined frequency (cycle) so as to designate each of word lines to be sequentially refreshed in accurate cycles determined according to the refresh cycle.

In refresh timer 100 in which a ring oscillator or the like is usually used, however, for example, when the power is turned on, it takes some time until the power becomes stable. Consequently, an oscillation period is unstable.

In the conventional refreshing control circuit configuration, therefore, since unstable refresh clock signal RCLK is supplied to refresh address generating circuit 200, there is the possibility of causing an erroneous operation such that a refresh address is not accurately generated.

SUMMARY OF THE INVENTION

An object of the invention is to provide a semiconductor device capable of preventing an erroneous operation in a refreshing control in a period where the state of refresh clock signal RCLK is unstable, typically at power-on.

A semiconductor memory device of the invention has: a memory array having a plurality of memory cells arranged in a matrix; a refresh timer for generating a refresh clock having a predetermined refresh cycle; a refresh executing circuit for sequentially refreshing the plurality of memory cells part by part on the basis of the cycle of the refresh clock; and a refreshing control circuit disposed between the refresh timer and the refresh executing circuit, for stopping transmission of the refresh clock from the refresh timer to the refresh executing circuit in a predetermined period in which the cycle of the refresh clock is unstable.

According to the semiconductor memory device, by providing the refresh control circuit between the refresh timer and the refresh executing circuit, the transmission of the refresh clock to the refresh executing circuit can be stopped in the predetermined period in which the cycle of the refresh clock is easy to become unstable. Thus, an erroneous operation of the circuit can be prevented.

Preferably, the refreshing control circuit sets a period which is a predetermined time elapsed since an operation source voltage of the refresh timer is started to be applied as the predetermined period.

Consequently, the transmission of the unstable refresh clock can be stopped in the predetermined time since the operation source voltage of the refresh timer is started to be applied.

Particularly, the refreshing control circuit includes: a first power-on reset circuit for generating a first initialization control signal which is activated when the operation source voltage exceeds a first threshold voltage at power-on; a delay circuit for delaying the first initialization control signal from the power-on reset circuit; and a logic circuit for forcedly fixing a signal level of the refresh clock until the first initialization control signal delayed by the delay circuit is activated.

Since the refresh control circuit includes the power-on reset circuit for receiving the operation source voltage and outputting the initialization control signal, the delay circuit for delaying the initialization control signal, and the logic circuit for forcedly fixing the signal level of the refresh clock until the initialization control signal delayed by the delay circuit is activated, the refresh clock can be stopped until the initialization control signal delayed by the delay circuit is activated.

Particularly, the semiconductor memory device further includes an internal circuit whose circuit state is initialized at the power-on, and initialization of the circuit state in the internal circuit is executed on the basis of the first initialization control signal from the first power-on reset circuit.

The power-on reset circuit can be used as a circuit dedicated to the refresh control circuit or can be commonly used by other internal circuits.

Particularly, the semiconductor memory device further includes: a second power-on reset circuit for generating a second initialization control signal which is activated when the operation source voltage exceeds a second threshold voltage at the power-on; and an internal circuit whose circuit state is initialized in response to the second initialization control signal.

By providing the power-on reset circuit also used by other internal circuits and the power-on reset circuit used for the refresh control circuit separately, the rising of the initialization control signal of each circuit can be independently designed.

Particularly, the delay circuit has: a plurality of signal routes arranged in parallel and having different signal propagation times; and a selection circuit for transmitting the first initialization control signal to one of the plurality of signal routes.

By having the plurality of signal routes of different signal propagation times and the selection circuit for transmitting the signal to one of the plurality of signal routes, the delay circuit can vary the delay time.

Particularly, the selection circuit has a distribution switch selectively formed between a node to which the first initialization control signal is transmitted and the plurality of signal routes.

With the configuration that the selection circuit has the distribution switch selectively formed between the plurality of signal routes having different signal propagation times, the delay time can be changed also in the process of manufacturing a wafer by using a masking process.

Particularly, the selection circuit has a fuse element which can be blown from the outside, the selection circuit generates a selection signal having a signal level according to whether the fuse element is blown or not, and the selection circuit further has a signal transmission gate for selectively transmitting the first initialization control signal to one of the plurality of signal routes in accordance with the selection signal.

Since the selection circuit has the fuse element which can be blown from the outside in a nonvolatile manner, generates a selection signal having a signal level according to whether the fuse element is blown or not, and further has a signal transmission gate for selectively transmitting the initialization control signal to one of the plurality of signal routes in accordance with the selection signal, the delay time can be changed even after the wafer manufacturing process.

Particularly, the selection circuit further has a test circuit for generating the selection signal in accordance with a test signal input from the outside in a test mode irrespective of whether the fuse element is blown or not.

Since the selection circuit further has the fuse element which can be blown from the outside in a nonvolatile manner, generates a selection signal having a signal level according to whether the fuse element is blown or not, has a transmission gate for selectively transmitting the initialization control signal to one of the plurality of signal routes in accordance with the selection signal, and further has the test circuit for generating the selection signal irrespective of whether the fuse element is blown or not, the fuse can be falsely blown, and delay time can be set by signal route selection of higher accuracy.

Particularly, the selection circuit has a pad electrically coupled to one of a plurality of voltages, the selection circuit generates a selection signal having a signal level according to a voltage of the pad, and the selection circuit further has a signal transmission gate for selectively transmitting the first initialization control signal to one of the plurality of signal routes in accordance with the selection signal.

Since the selection circuit has the pad electrically coupled to one of a plurality of voltages, generates a selection signal having a signal level according to one of the plurality of voltages coupled to the pad, and further has the transmission gate for selectively transmitting the initialization control signal to one of the plurality of signal routes in accordance with the selection signal, the delay time can be changed by a signal from the external pad.

Particularly, the selection circuit further has a test circuit for generating the selection signal in accordance with a test signal input from the outside in a test mode irrespective of the voltage of pad.

Since the selection circuit has the pad electrically coupled to one of a plurality of voltages, generates a selection signal having a signal level according to one of the plurality of voltages coupled to the pad, has the transmission gate for selectively transmitting the initialization control signal to one of the plurality of signal routes in accordance with the selection signal, and further has the test circuit for generating the selection signal irrespective of whether or not the pad is electrically coupled to one of the plurality of voltages, the pad can be falsely coupled to a voltage. Thus, the delay time can be set by signal route selection of higher accuracy.

Particularly, the selection circuit has a rewritable memory circuit for holding data, the selection circuit generates a selection signal having a signal level according to the data read from the memory circuit, and the selection circuit further has a signal transmission gate for selectively transmitting the first initialization control signal to one of the plurality of signal routes in accordance with the selection signal.

Since the selection circuit has the rewritable memory circuit for holding data, generates a selection signal having a signal level according to the data by reading the data held in the memory circuit, and further has a signal transmission gate for selectively transmitting the initialization control signal to one of the plurality of signal routes in accordance with the selection signal, the delay time can be changed by rewriting the memory.

Particularly, the semiconductor memory device is mounted on one of a plurality of chips sealed in the same package, the selection circuit generates a selection signal having a signal level according to the data input from a data-rewritable memory circuit formed in another one of the plurality of chips, and the selection circuit further has a signal transmission gate for transmitting the first initialization control signal to one of the plurality of signal routes in accordance with the selection signal.

Since the semiconductor memory device of the invention is mounted on one of a plurality of chips sealed in the same package, and the selection circuit generates a selection signal having a signal level according to data input from a data-rewritable memory circuit formed on another one of the plurality of chips, and further has a signal transmission gate for transmitting the initialization control signal to one of the plurality of signal routes having different signal propagation times in accordance with the selection signal, the delay time can be changed by rewriting the memory circuit formed on the another one of the plurality of chips.

Preferably, the refreshing control circuit sets, as the predetermined period, a period of a predetermined time elapsed since a timing at which a predetermined control signal input from the outside is set in a predetermined state.

The refreshing control circuit can stop transmission of an unstable refresh clock during the period of a predetermined time elapsed since a timing at which a predetermined control signal input from the outside is set in a predetermined state.

The refreshing control circuit includes: a signal generating circuit for generating a refresh status control signal which is activated when the predetermined control signal enters the predetermined status; a delay circuit for delaying the refresh status control signal from the signal generating circuit; and a logic circuit for forcedly fixing a signal level of the refresh clock until the refresh status control signal delayed by the delay circuit is activated.

By including the timing control circuit for generating a timing signal which is activated when the predetermined control signal enters the predetermined status; the delay circuit for delaying the timing signal from the timing control circuit; and the logic circuit for forcedly fixing a signal level of the refresh clock until the timing signal delayed by the delay circuit is activated, transmission of the unstable refresh clock can be stopped.

Particularly, the predetermined control signal is a single signal, and the predetermined control signal is not used in a normal operation of the semiconductor memory device.

By using the single signal which is not used in a normal operation of the semiconductor memory device as the predetermined control signal, the configuration of the refresh control circuit is simplified.

Particularly, the refreshing control circuit starts the predetermined period when the predetermined control signal maintains the predetermined status for a predetermined time.

When the predetermined control signal maintains the predetermined status for a predetermined time, the refresh control circuit can stop the transmission of an unstable refresh clock.

Particularly, the predetermined control signal includes a plurality of signals used in a normal operation of the semiconductor memory device, and the predetermined status corresponds to a predetermined combination of signal levels of the plurality of signals.

With the configuration that the predetermined control signal includes a plurality of signals used in a normal operation of the semiconductor memory device, and the predetermined status corresponds to a predetermined combination of signal levels of the plurality of signals, the noise-immune refresh control circuit capable of preventing erroneous operation can be designed.

Particularly, the refreshing control circuit starts the predetermined period when the predetermined control signal maintains the predetermined status for a predetermined time.

When the predetermined control signal maintains the predetermined status for a predetermined time, the refresh control circuit can stop the transmission of an unstable refresh clock.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
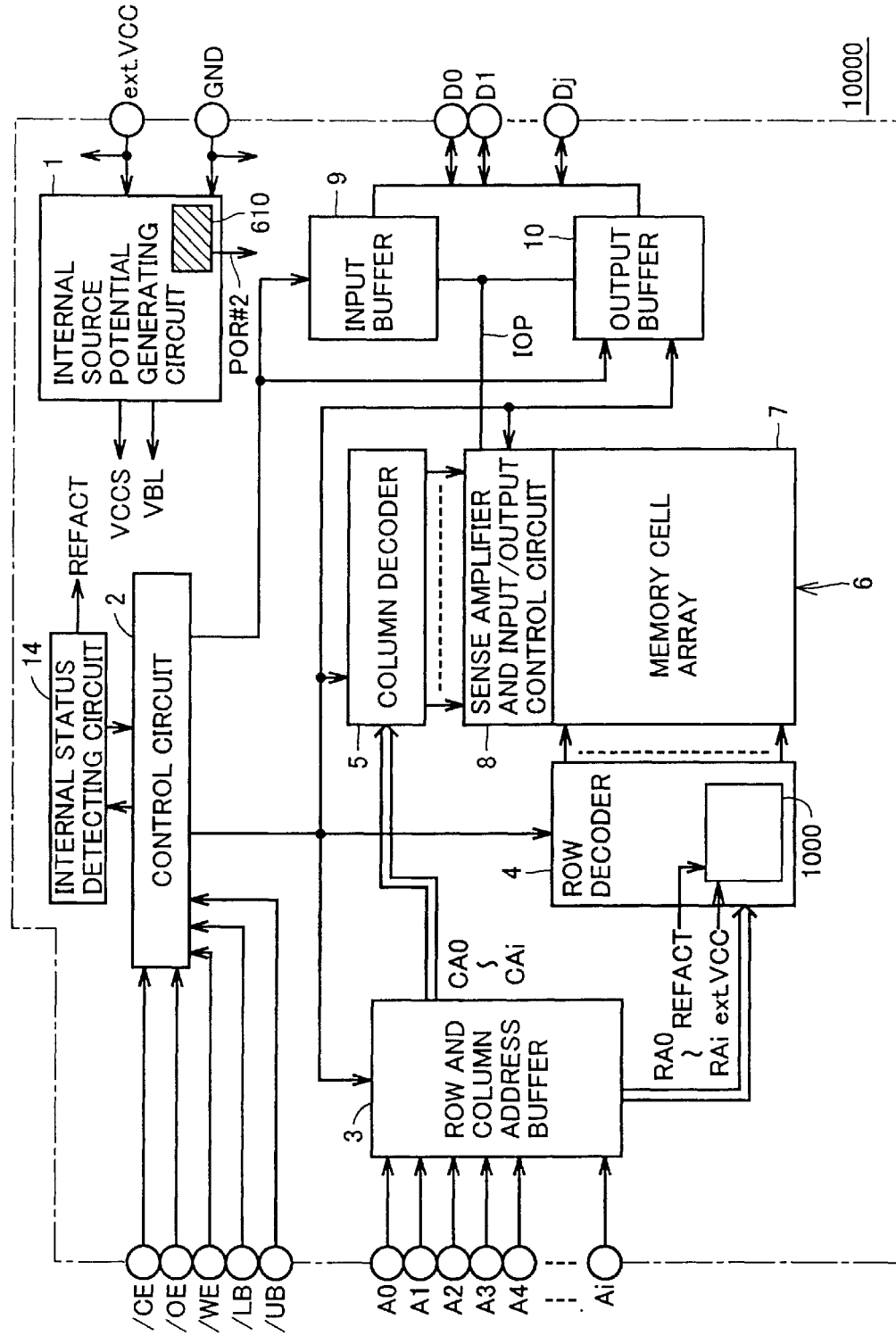
FIG. 1 is a schematic block diagram showing the configuration of a whole DRAM 10000 with a complete hidden refreshing function.

Embodiments of the invention will be described in detail with reference to the drawings. The same components are designated by the same reference numerals in the drawings and their description will not be repeated.

First Embodiment

Referring to FIG. 1, a DRAM 10000 with a complete hidden refreshing function according to a first embodiment has an internal source potential generating circuit 1, a control circuit 2, a row and column address buffer 3, a row decoder 4, a column decoder 5, a memory mat 6, an input buffer 9, an output buffer 10, and an internal status detecting circuit 14. Memory mat 6 includes a memory cell array 7 and a sense amplifier and input/output control circuit 8. Row decoder 4 includes a row selection control circuit 1000.

Internal source potential generating circuit 1 receives an external source voltage ext.VCC and a ground voltage GND, and generates internal source potentials VCCS and VBL.

Control circuit 2 selects a predetermined operation mode on the basis of a chip enable signal /CE, an output enable signal /OE, a write enable signal /WE, a lower bit enable signal /LB, and an upper byte enable signal /UB supplied from the outside and outputs control signals to the circuits including the internal status detecting circuit 14.

Internal status detecting circuit 14 detects that the whole DRAM enters an operating state such as an initialization state on the basis of a signal from control circuit 2 and generates control signals including a refresh executable signal REFACT indicating that a refreshing operation can be performed.

Row and column address buffer 3 generates row address signals RA0 to RAi (hereinbelow, called external address signals) and column address signals CA0 to CAi on the basis of address signals A0 to Ai (where i denotes an integer of 0 or larger) supplied from the outside, and supplies generated signals RA0 to RAi and CA0 to CAi to row decoder 4 and column decoder 5, respectively.

Memory cell array 7 includes a plurality of memory cells arranged in a matrix, each for storing one-bit data. Each memory cell is disposed in a predetermined address determined by a row address and a column address.

Row decoder 4 includes row selection control circuit 1000 and generates an internal address in response to external address signals RA0 to RAi from row and column address buffer 3 and the refresh address signal to designate a row address in memory cell array 7. Column decoder 5 designates a column address in memory cell array 7 in response to column address signals CA0 to CAi supplied from row and column address buffer 3. The sense amplifier and input/output control circuit 8 connects the memory cell in the address designated by row decoder 4 and column decoder 5 to one end of a pair IOP of data input/output lines. The other end of the pair IOP of data input/output lines is connected to input buffer 9 and output buffer 10.

In a writing mode, input buffer 9 supplies data Dj (where j denotes a natural number) input from the outside to the selected memory cell via the pair IOP of data input/output lines in response to a control signal supplied from control circuit 2. In a reading mode, output buffer 10 outputs read data from the selected memory cell to the outside in response to a control signal supplied from control circuit 2.

Figure 2:
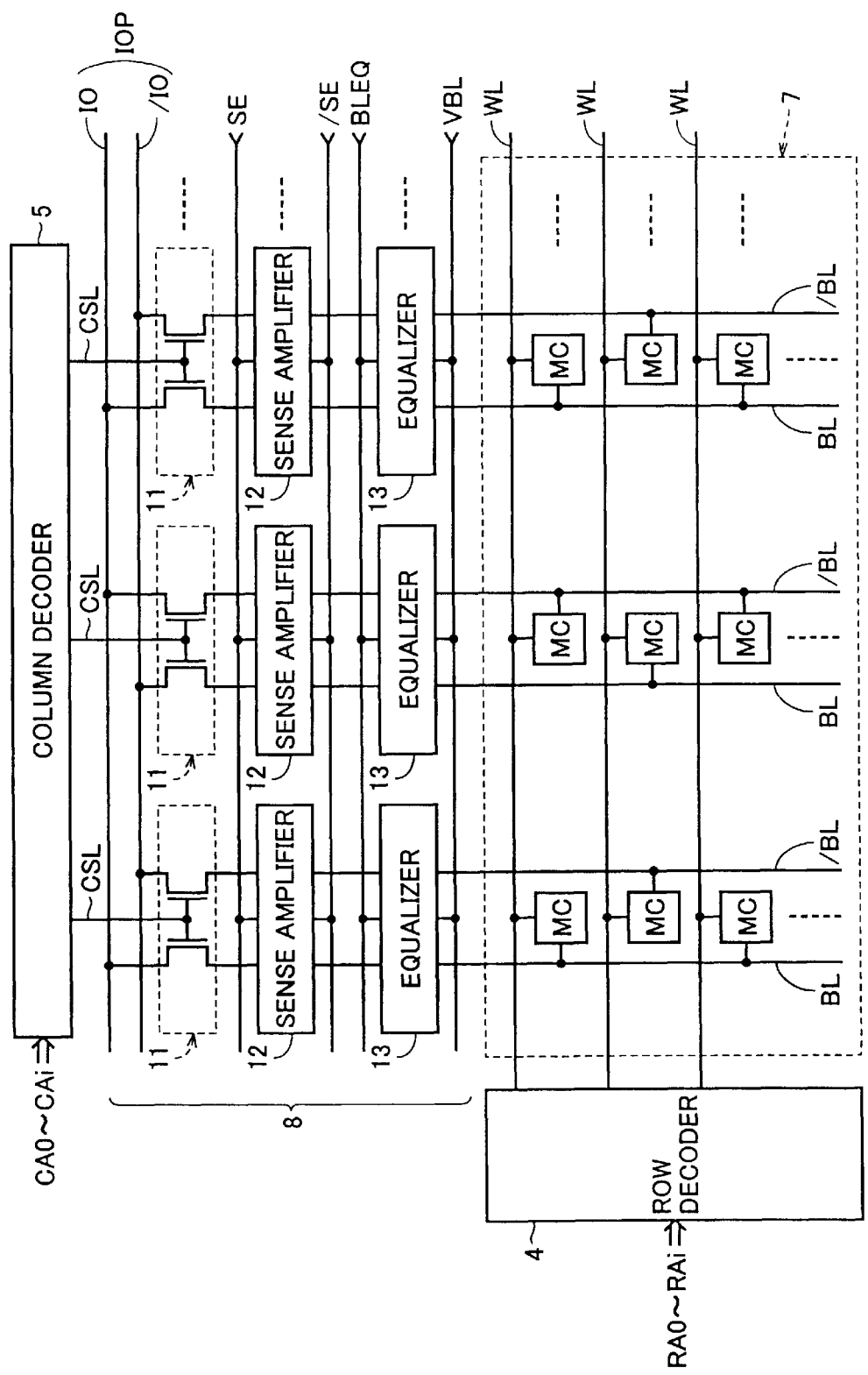
FIG. 2 is a block diagram showing the configuration of a memory mat 6 in DRAM with a complete hidden refreshing function illustrated in FIG. 1.

Referring to FIG. 2, memory cell array 7 includes a plurality of memory cells MC arranged in a matrix, word lines WL provided in correspondence with the rows, and pairs of bit lines BL and /BL provided in correspondence with the columns. Each memory cell MC is a known one including an N-channel MOS transistor for an access and a capacitor for information storage. Word line WL transmits an output of row decoder 4 and activates memory cells MC of the selected row. The pair of bit lines BL and /BL inputs/outputs a data signal from/to selected memory cell MC.

The sense amplifier and input/output control circuit 8 includes a pair (IOP) of data input/output lines IO and /IO, a column selection gate 11 provided in correspondence with each column, a sense amplifier 12, and an equalizer 13. Column selection gate 11 includes a pair of N-channel MOS transistors connected between the pair of bit lines BL and /BL and the pair of data input/output lines IO and /IO. The gates of the pair of N-channel MOS transistors of each column selection gate 11 are connected to column decoder 5 via a column selection line CSL. In column decoder 5, when column selection line CSL goes high ("H" level), the pair of N-channel MOS transistors are made conductive, and the pair of bit lines BL and /BL and the pair of data input/output lines IO and /IO are coupled to each other.

Sense amplifier 12 amplifies a very small potential difference between the pair of bit lines BL and /BL to the voltage corresponding to the internal source potential VCCS (<ext.VCC) when sense amplifier activate signals SE and /SE go high ("H" level) and low ("L" level), respectively. Equalizer 13 equalizes the potential of the pair of bit lines BL and /BL to a bit line potential VBL (=VCCS/2) when a bit line equalize signal BLEQ goes high ("H" level) which is an activate level.

Figure 3:
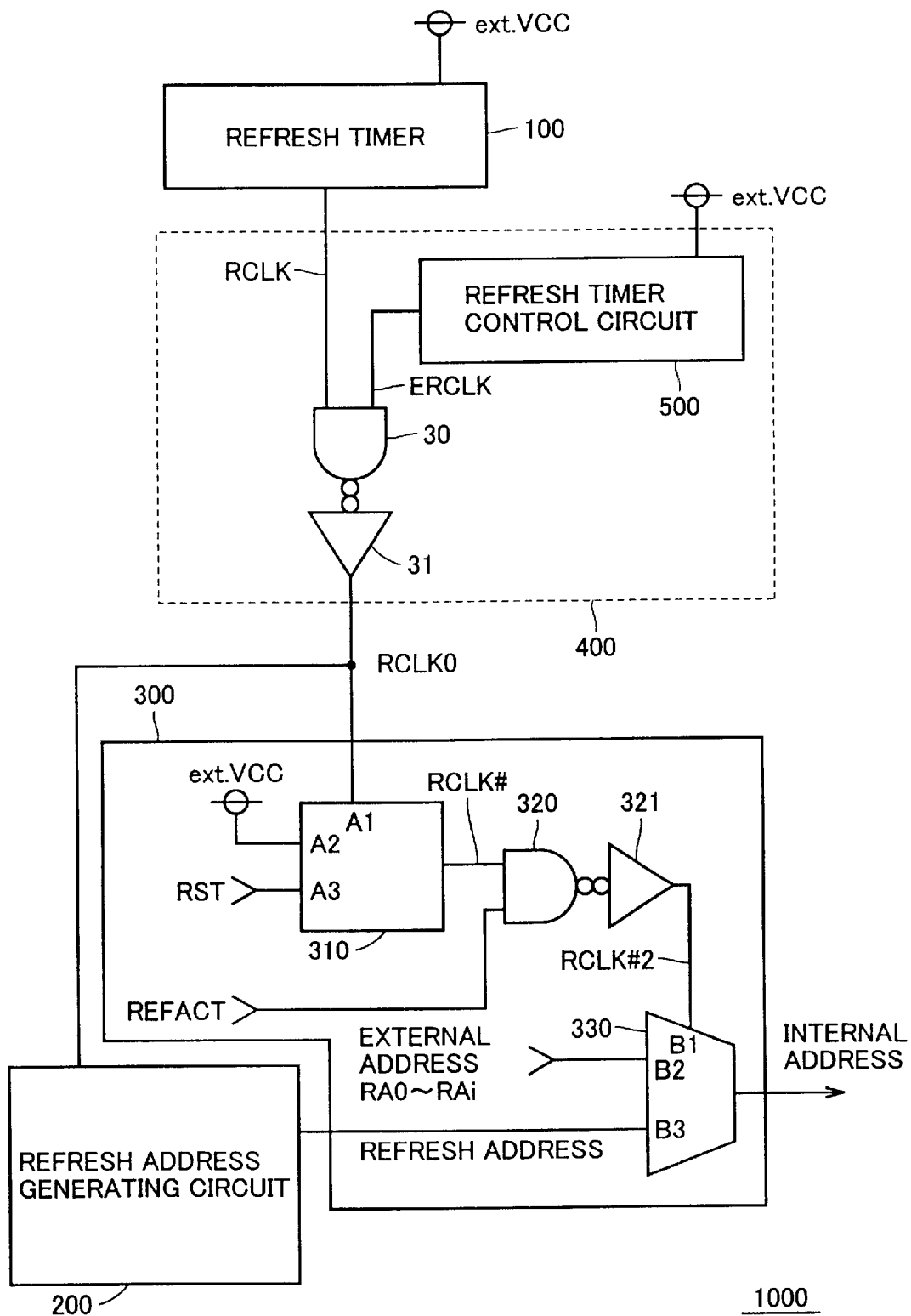
FIG. 3 is a diagram showing an example of a row selection control circuit 1000 including a refreshing control circuit 400 according to a first embodiment of the invention.

FIG. 3 is a diagram showing an example of row selection control circuit 1000 including a refreshing control circuit 400 of the first embodiment of the invention.

When the refreshing operation becomes necessary in DRAM with the complete hidden refreshing function, row selection control circuit 1000 generates a refresh address signal. External address signals RA0 to RAi or the refresh address signal is selected and an internal address is generated to designate a row address.

Row selection control circuit 1000 has refresh timer 100, refresh address generating circuit 200, internal address generating circuit 300, and refreshing control circuit 400.

Figure 4:
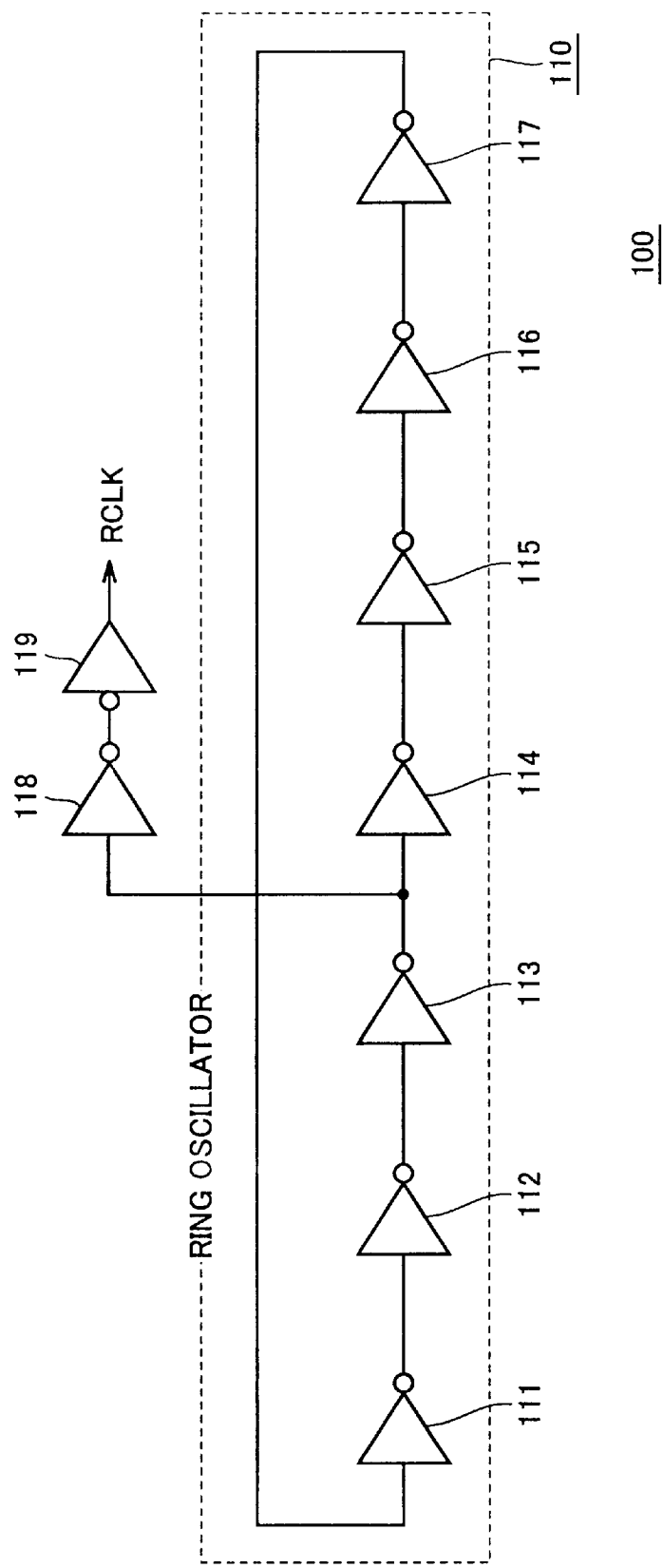
FIG. 4 is a diagram showing a refresh timer 100.

Referring to FIG. 4, refresh timer 100 generates a refresh clock RCLK having a predetermined refresh cycle.

Refresh timer 100 includes a ring oscillator 110 as an oscillation circuit.

Ring oscillator 110 is constructed by inverters 111 to 117 annularly connected.

Refresh clock signal RCLK as an output signal of refresh timer 100 is output from the output node of inverter 113 in ring oscillator 110 via inverters 118 and 119.

Referring again to FIG. 3, refreshing control circuit 400 has a refresh timer control circuit 500, an NAND circuit 30 and an inverter 31.

Refreshing control circuit 400 is intended for control of the signal level of a refresh clock control signal RCLK0 as an output signal of refreshing control circuit 400 to prevent refresh clock signal RCLK as an output signal of refresh timer 100 from being transmitted in a predetermined period during which the cycle of refresh clock signal RCLK tends to be unstable.

Figure 5:
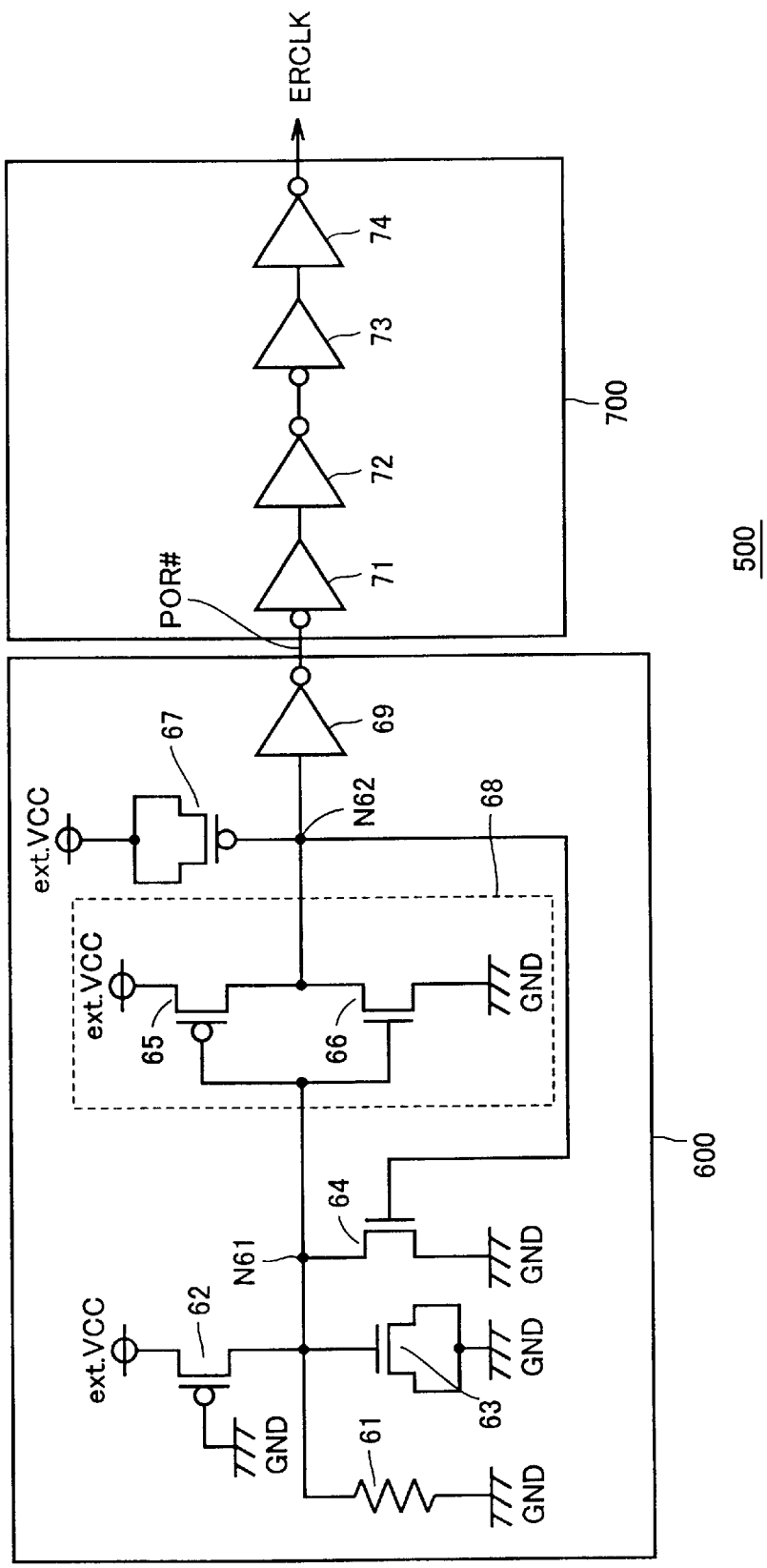
FIG. 5 is a diagram showing the configuration of a refresh timer control circuit 500.

Referring to FIG. 5, refresh timer control circuit 500 has a power-on reset circuit (hereinbelow, referred to as a POR circuit) 600 and a delay circuit 700.

POR circuit 600 is a circuit for resetting an internal circuit when external source voltage ext.VCC is supplied. An output signal POR# of POR circuit 600 is at "L" level until external source voltage ext.VCC increases from 0V to a predetermined voltage Vres. When external source voltage ext.VCC exceeds predetermined voltage Vres, output signal POR# goes high to "H" level.

POR circuit 600 has P-channel MOS transistors 62 and 67, N-channel MOS transistors 63 and 64, CMOS inverters 68 and 69, and a resistive element 61 of high resistance.

P-channel MOS transistor 62 is connected between the line of external source voltage ext.VCC and a node N61 and its gate electrode is connected to a ground voltage GND.

Resistive element 61 of high resistance is connected between node N61 and the line of ground voltage GND.

The gate electrode of N-channel MOS transistor 63 is connected to node N61, and the source and drain electrodes are connected to the line of ground voltage GND.

N-channel MOS transistor 64 is connected between node N61 and the line of ground voltage GND, and its gate electrode is connected to a node N62.

Inverter 68 includes a P-channel MOS transistor 65 and an N-channel MOS transistor 66. P-channel MOS transistor 65 is connected between the line of external source voltage ext.VCC and node N62, and its gate electrode is connected to node N61. N-channel MOS transistor 66 is connected between node N62 and the line of ground voltage GND, and its gate electrode is connected to node N61.

The gate electrode of P-channel MOS transistor 67 is connected to node N62 and its source and drain electrodes are connected to the line of external source voltage ext.VCC.

Node N62 is connected to the input node of inverter 69. An output signal of inverter 69 is signal POR#.

A threshold voltage Vres of POR circuit 600 will now be described.

A voltage V1 at node N61 is equal to a value obtained by dividing external source voltage ext.VCC by on-resistance of P-channel MOS transistor 62 and on-resistance of N-channel MOS transistor 64.

When the on-resistance of P-channel MOS transistor 62 is set as R61 and that of N-channel MOS transistor 64 is set as R62, V1=ext.VCC×R62/(R61+R62).

Signal POR# is at "L" level until value V1 is below the threshold voltage of inverter 68 (that is, a threshold voltage VTN of N-channel MOS transistor 66). Signal POR# becomes "H" level when value V1 exceeds the threshold voltage VTN.

Threshold voltage Vres at which voltage V1 of node N61 changes from "L" level to "H" level is obtained as follows.

$$Vres=VTN\times(R61+R62)/R62$$

That is, POR circuit 600 outputs a signal of "H" level to delay circuit 700 when external source voltage ext.VCC exceeds threshold voltage Vres.

Delay circuit 700 is intended for delaying an input signal by a predetermined time.

Delay circuit 700 includes inverters 71 to 74.

Figure 6:
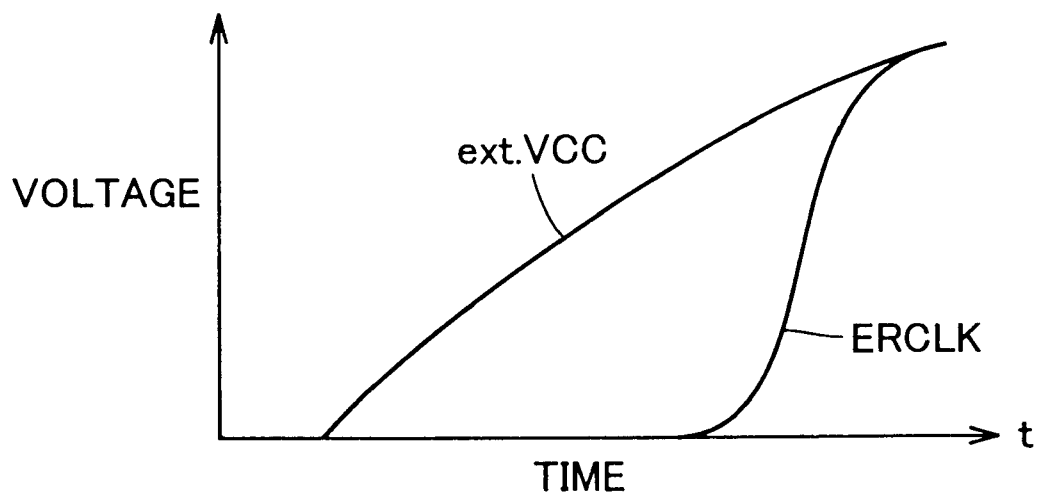
FIG. 6 is a diagram for comparing the rising of an external source voltage ext.Vcc and the rising of a refresh timer control signal ERCLK.

FIG. 6 is a diagram for comparing the rising of external source voltage ext.Vcc and the rising of a refresh timer control signal ERCLK as an output signal of refresh timer control circuit 500, which is output from delay circuit 700.

Refreshing control circuit 400 outputs a result of an NAND logic operation between refresh clock signal RCLK as an output signal of refresh timer 100 input to NAND circuit 30 and refresh timer control signal ERCLK as an output signal of refresh timer control circuit 500 as refresh clock control signal RCLK0 to the refresh address generating circuit 200 and internal address generating circuit 300 via inverter 31. When refresh timer control signal ERCLK is at "L" level, therefore, irrespective of the signal level of refresh clock signal RCLK, refresh clock control signal RCLK0 is at "L" level, and the signal level of refresh clock signal RCLK is not transmitted. On the other hand, when refresh timer control signal ERCLK is at "H" level, the signal level of refresh clock signal RCLK is transmitted to the refresh clock control signal RCLK0.

Referring again to FIG. 3, refresh address generating circuit 200 receives refresh clock control signal RCLK0, generates a refresh address in a refreshing operation, and outputs the refresh address to internal address generating circuit 300.

Internal address generating circuit 300 receives address signals generated by row and column address buffer 3 and refresh address generating circuit 200, selects one of the address signals, and generates an internal address to thereby designate a row address. By refresh address generating circuit 200 and internal address generating circuit 300, the refreshing operation is executed part by part on the plurality of memory cells on the basis of refresh clock signal RCLK.

As shown in FIG. 3, internal address generating circuit 300 has a latch circuit 310, an NAND circuit 320, an inverter 321, and a selector 330.

Figure 7:
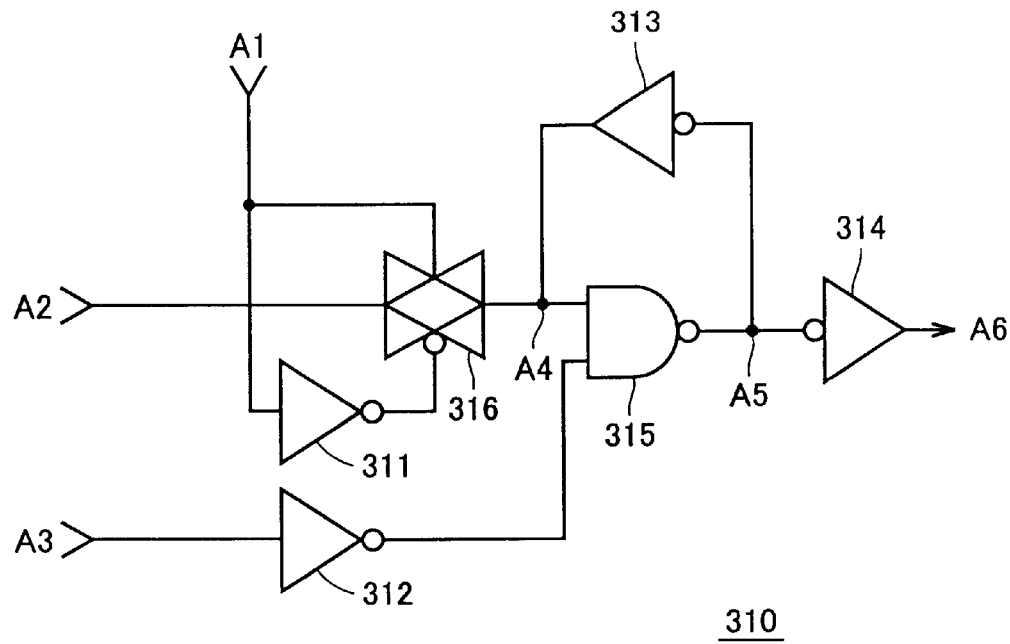
FIG. 7 is a diagram showing the configuration of a latch circuit 310.

Referring to FIG. 7, latch circuit 310 has inverters 311 to 314, an NAND circuit 315, and a transmission gate 316.

Transmission gate 316 is connected between nodes A2 and A4. Transmission gate 316 operates according to the signal level of a node A1.

NAND circuit 315 outputs a result of the NAND logic operation between a signal transmitted to node A4 and a signal obtained by inverting a signal of a node A3 by inverter 312.

Inverter 311 inverts a signal transmitted to node A1 and outputs the inverted signal to transmission gate 316.

Inverter 314 inverts the signal transmitted to node A5 and outputs the inverted signal to an output node A6.

Inverter 313 inverts the signal transmitted to node A5 and outputs the inverted signal to node A4.

The operation of latch circuit 310 will be described.

Referring again to FIG. 3, in latch circuit 310, refresh clock control signal RCLK0 as an activate signal is input to node A1, external source voltage ext.VCC is input to node A2, and reset signal RST is input to node A3.

When refresh clock control signal RCLK0 as an activate signal is at "H" level, transmission gate 316 is turned on. Accordingly, external source voltage ext.VCC ("H" level) is supplied to node A4, so that node A4 goes high ("H" level).

When it is assumed that reset signal RST is at "L" level in an initial state, the signal is inverted by inverter 312, and the signal at "H" level is input to NAND circuit 315. In the case where refresh clock control signal RCLK0 is at "H" level, output node A5 of NAND circuit 315 is at "L" level, and output node A6 becomes at "H" level via inverter 314.

Since node A4 is latched at "H" level by inverter 313, an output of NAND circuit 315 is at "L" level until reset signal RST ("H" level) is input.

On the other hand, when refresh clock control signal RCLK0 as an activate signal is at "L" level, transmission gate 316 is turned off. Accordingly, input node A4 of NAND circuit 315 goes low, output node A5 of NAND circuit 315 goes high, and output node A6 is set to "L" level via inverter 314.

NAND circuit 320 outputs a result of the NAND logic operation between a refresh clock control signal RCLK# of latch circuit 310 and refresh executable signal REFACT as a refresh clock control signal RCLK#2 to selector 330 via inverter 321.

Selector 330 is activated by refresh clock control signal RCLK#2, receives an external address signal generated by row and column address buffer 3 and the refresh address generated by refresh address generating circuit 200, and selects one of them as an internal address.

Figure 8:
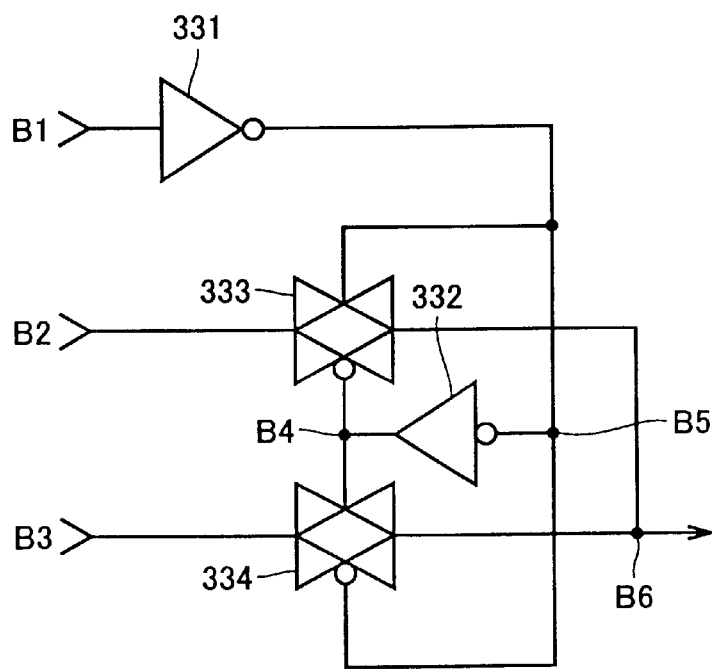
FIG. 8 is a diagram showing the configuration of a selector 330.

Referring to FIG. 8, selector 330 has inverters 331 and 332 and transmission gates 333 and 334.

Transmission gate 333 is connected between nodes B2 and B6 and operates according to the signal level of a node B5.

Transmission gate 334 is connected between a node B3 and node B6 and operates according to the signal level of node B5.

Inverter 331 inverts a signal sent to a node B1 and outputs the inverted signal to node B5.

Inverter 332 inverts the signal transmitted to node B5 and outputs the inverted signal to a node B4.

The operation of selector 330 will now be described.

Referring again to FIG. 3, in selector 330, refresh clock control signal RCLK#2 as an activate signal is input to node B1, an external address is input to node B2, and a refresh address is input tot he node B3.

When refresh clock control signal RCLK#2 as an activate signal input to node B1 is at "H" level, transmission gate 333 is turned off by inverters 331 and 332. On the other hand, transmission gate 334 is turned on.

Therefore, the refresh address of node B3 is supplied to output node B6 of selector 330.

On the other hand, when the activate signal input to node B1 is at "L" level, transmission gate 333 is turned on by inverters 331 and 332. On the other hand, transmission gate 334 is turned off.

The external address signal of node B2 is therefore supplied to output node B6 of selector 330.

Figure 9:
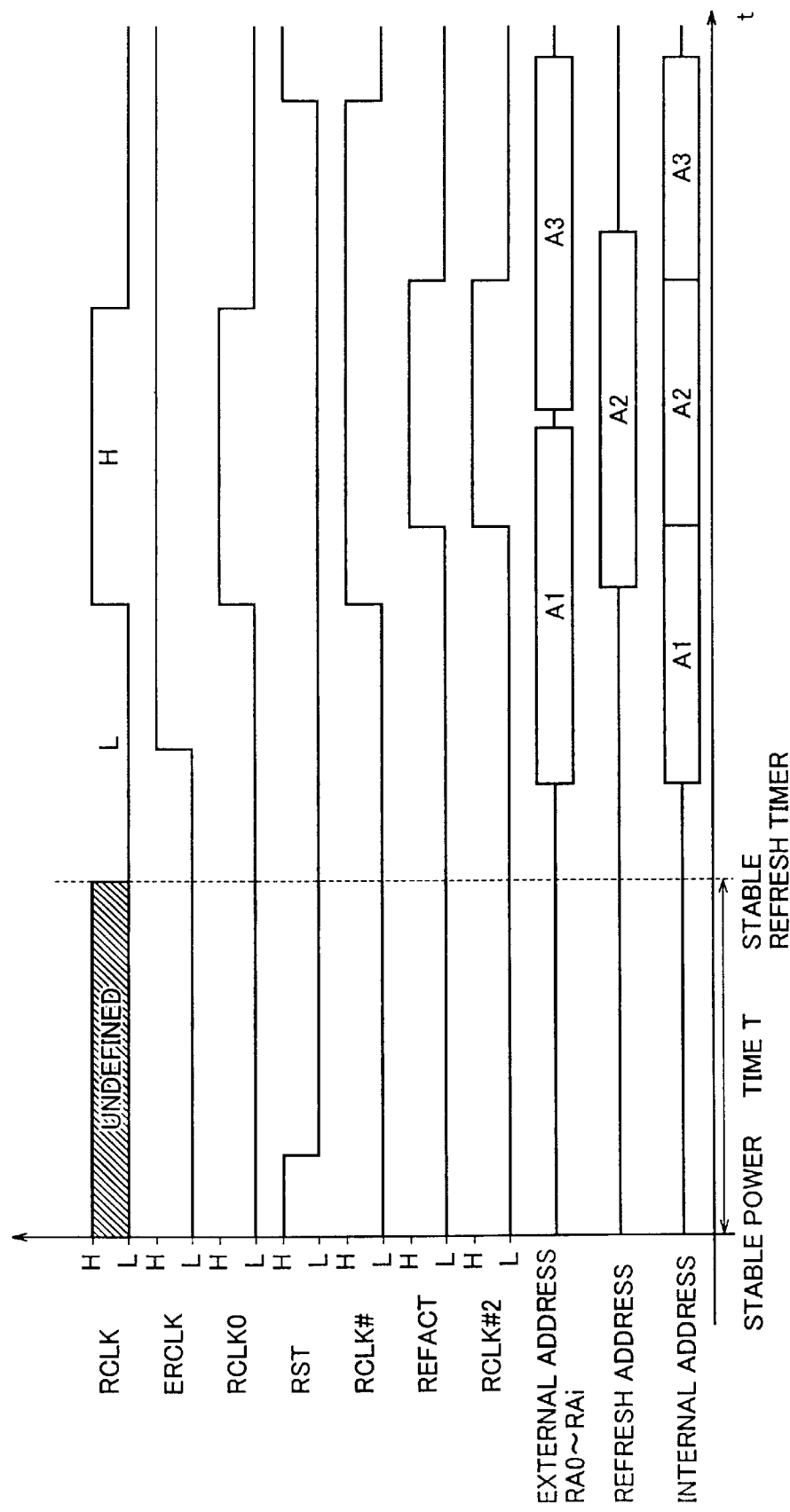
FIG. 9 is a time chart of a row selection control circuit 1000 of the first embodiment of the invention.

Referring to FIG. 9, the operation of row selection control circuit 1000 of the first embodiment of the invention will be described.

As stated in "Background Art", when power is turned on, the cycles of the ring oscillator in refresh timer 100 are unstable. Consequently, refresh clock signal RCLK is undefined.

Since refresh timer control circuit 500 has POR circuit 600 and delay circuit 700, at the turn-on, refresh timer control signal ERCLK as an output signal is at "L" level.

After external source voltage ext.VCC exceeds threshold voltage Vres of POR circuit 600 and a predetermined delay time by delay circuit 700 elapses, refresh timer control signal ERCLK goes high ("H" level).

By the operation, refresh clock control signal RCLK0 is transmitted to refresh address generating circuit 200 and generation of the refresh address is started.

While refresh clock signal RCLK is undefined, refresh clock control signal RCLK0 at "L" level is input to refresh address generating circuit 200, and no refresh address is generated.

At the turn-on, refresh clock control signal RCLK# as an output signal of latch circuit 310 is at "L" level. After elapse of a time T since the power source becomes stable, refresh timer control signal ERCLK goes high. Consequently, refresh clock control signal RCLK0 input to latch circuit 310 goes high. Accordingly, refresh clock control signal RCLK# as an output signal of latch circuit 310 is latched at "H" level.

When refresh executable signal REFACT becomes at "H" level, refresh clock control signal RCLK#2 for activating selector 330 goes high. When refresh clock control signal RCLK#2 for activating selector 330 goes high in response to "H" level of refresh clock control signal RCLK#2, selector 330 is activated, and the internal address is switched from the external address to the refresh address.

With the configuration according to the first embodiment of the invention, by further providing row selection control circuit 1000 with refreshing control circuit 400, an unstable oscillation signal of refresh clock signal RCLK as an output signal of refresh timer 100 at the turn-on of the power source can be interrupted so as not to be supplied to the refresh address generating circuit 200. Thus, an erroneous operation of the circuit after turn-on can be prevented.

The first embodiment of the invention shows the configuration such that POR circuit 600 in refresh timer control circuit 500 is used also as a circuit for resetting another internal circuit. An independent POR circuit 610 (having the configuration similar to that of POR circuit 600) can be also provided, for example, in internal source potential generating circuit 1 in FIG. 1.

With the configuration, the other internal circuit may be initialized on the basis of an output signal of POR circuit 610.

In this case, the threshold voltage of POR circuit 600 and that of POR circuit 610 are independent of each other, and another internal circuit is initialized on the basis of POR circuit 610. Consequently, POR circuit 600 can be used as a circuit dedicated to the refreshing control.

Second Embodiment

Figure 10:
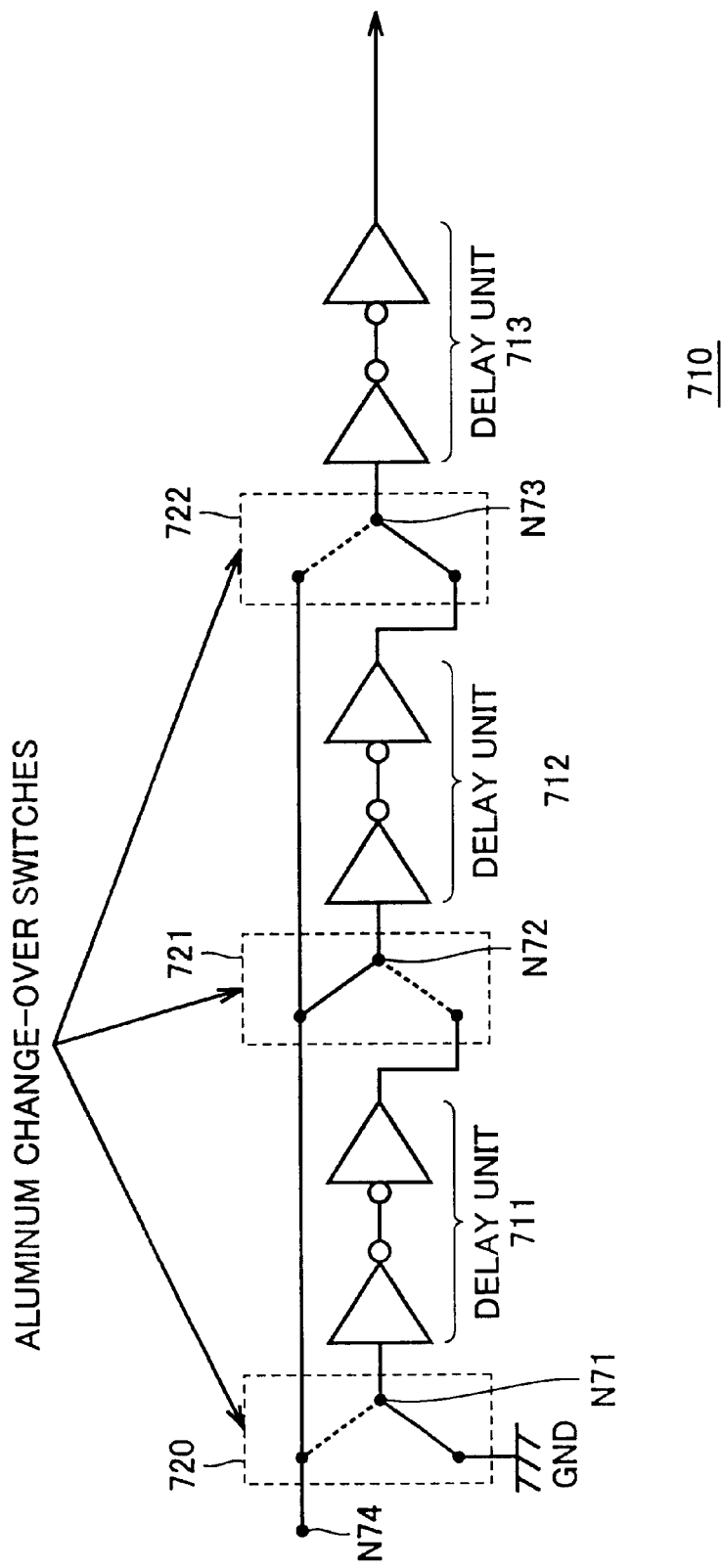
FIG. 10 is a diagram showing a delay circuit 710 of a second embodiment of the invention.

Referring to FIG. 10, a delay circuit 710 is a circuit which can be replaced by delay circuit 700 of the first embodiment of the invention and can switch a signal route passing through a delay stage by switching a mask.

Delay circuit 710 has delay units 711 to 713 and aluminum changeover switches 720 to 722 including nodes N71 to N73, respectively.

Aluminum change-over switch 720 is connected between a node N74 and delay unit 711 and switches node N71 to either node N74 or ground voltage GND.

Aluminum change-over switch 721 is connected between delay units 711 and 712 and switches node N72 to either node N74 or an output side of delay unit 711.

Aluminum change-over switch 722 is connected between delay units 712 and 713 and switches node N73 to either node N74 or an output side of delay unit 712.

For example, by a masking process, by connecting node N71 to node N74, connecting node N72 to the output side of delay unit 711, and connecting node N73 to the output side of delay unit 712, the signal route passes through delay units 711 to 713 of three stages.

Figure 11:
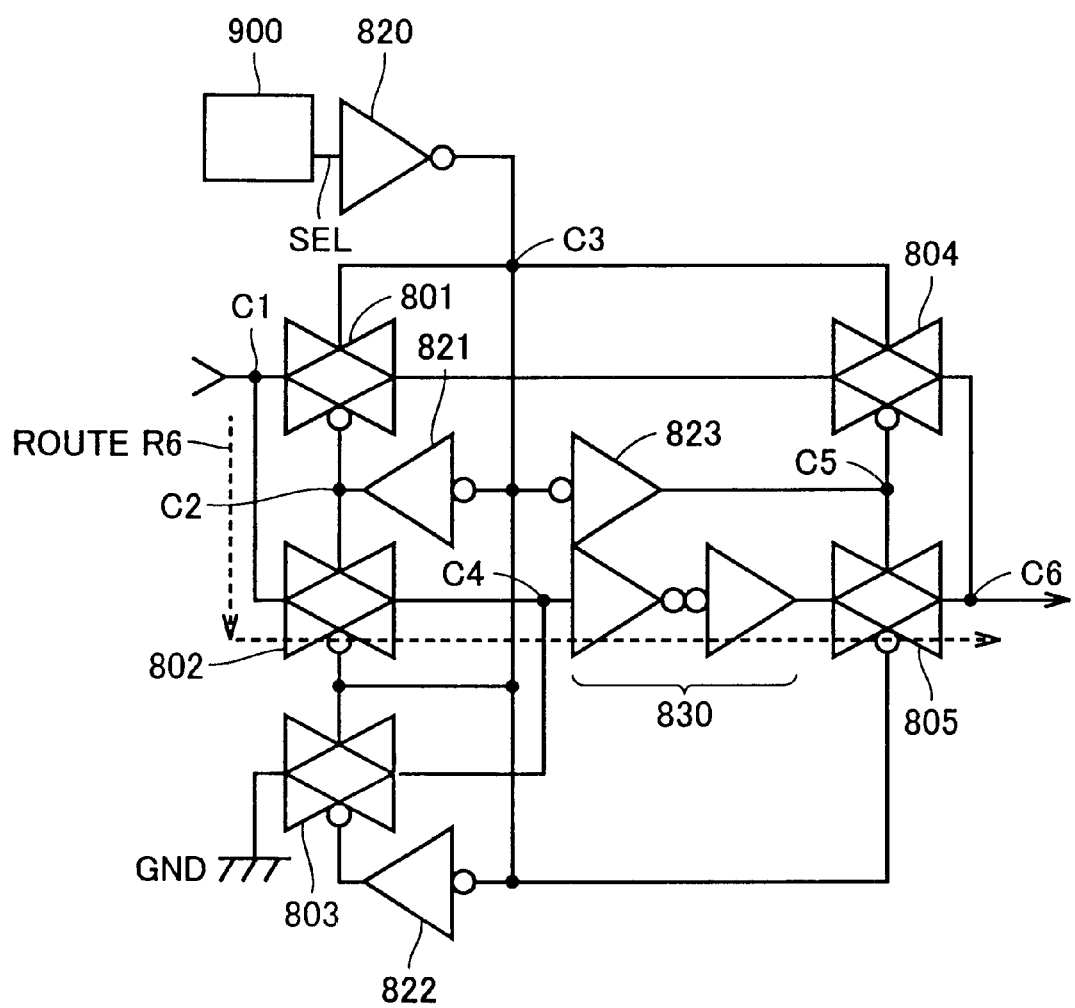
FIG. 11 is a diagram showing a delay circuit 800 as another configuration of the second embodiment of the invention.

Referring to FIG. 11, a delay circuit 800 is a circuit which can be replaced by first delay circuit 700 of the first embodiment of the invention and switches a signal route passing through delay stages on the basis of an output signal of a selector 900.

Delay circuit 800 has selector 900, transmission gates 801 to 805, inverters 820 to 823, and a delay unit 830.

An output signal of selector 900 is inverted by inverter 820 and the inverted signal is transmitted to a node C3.

Inverter 821 inverts a signal to be transmitted to node C3 and outputs the inverted signal to a node C2.

Inverter 823 inverts a signal transmitted to node C3 and outputs the inverted signal to a node C5.

Transmission gates 801 and 804 are connected in series between an input node C1 and an output node C6 and operate according to the signal level of node C3.

Transmission gate 802 is connected between input node C1 and a node C4.

Delay unit 830 and transmission gate 805 are connected in series between node C4 and output node C6.

Transmission gates 805 and 802 operate according to the signal level of node C3.

Transmission gate 803 is connected between ground voltage GND and node C4.

Transmission gate 803 operates according to the signal level of node C3.

Inverter 822 inverts a signal transmitted to node C3 and outputs the inverted signal to transmission gate 803.

The operation of delay circuit 800 will be described.

Delay circuit 800 is activated by an output signal SEL of selector 900.

When output signal SEL of selector 900 is at "L" level, the level of node C3 goes high ("H" level) by inverter 820.

Consequently, transmission gates 801 and 804 are turned on, and the signal at input node C1 is transmitted as it is to output node C6.

On the other hand, when output signal SEL of selector circuit 900 is at "H" level, node C3 is set to "L" level by inverter 820.

Therefore, transmission gates 802 and 805 are turned on, and the signal at input node C1 is transmitted to output node C6 via a signal route (R6) passing through delay unit 830.

Figure 12:
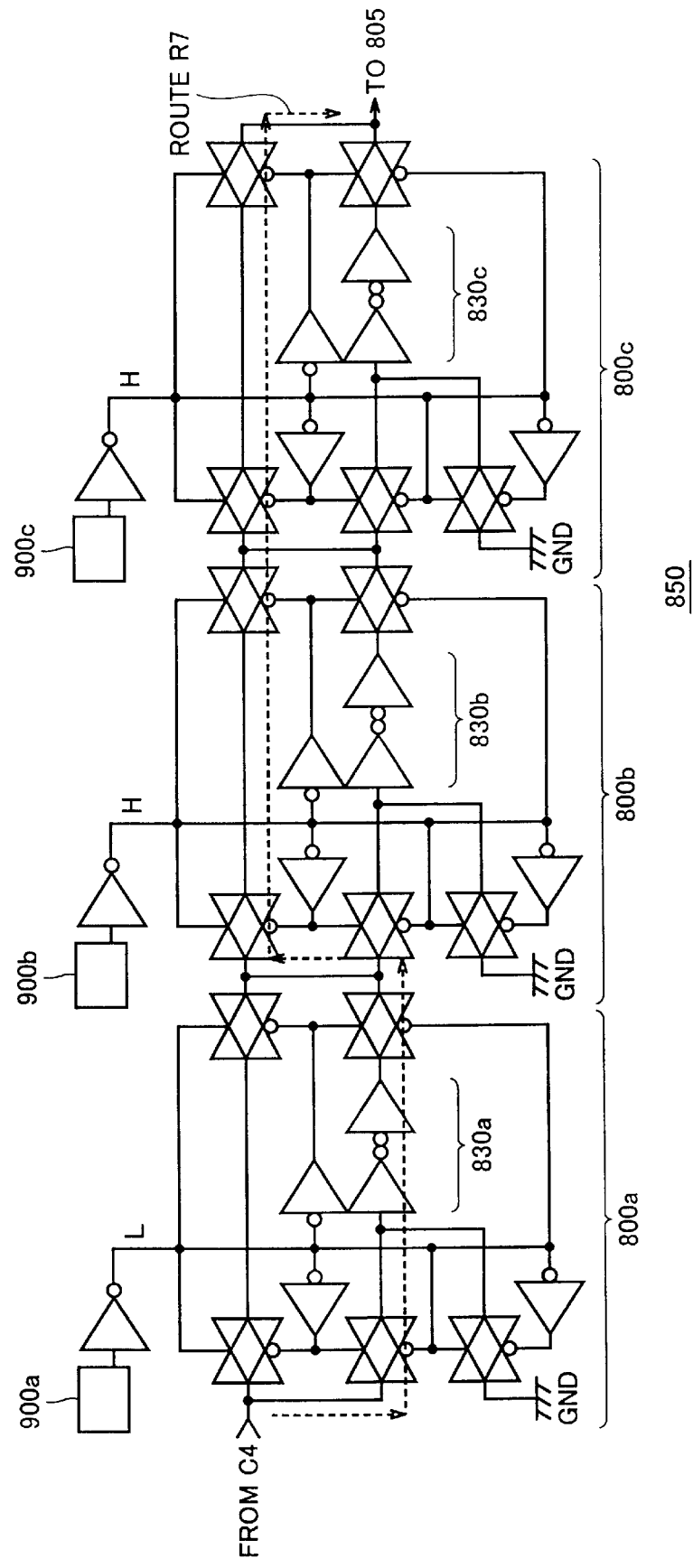
FIG. 12 is a diagram showing a delay circuit 850 in which three delay circuits 800 are connected in series.

Referring to FIG. 12, a delay circuit 850 has delay circuits 800a to 800c connected in series, including selector circuits 900a to 900c and delay units 830a to 830c, respectively. Each of delay units 830a to 830c has same structure.

For example, when output signal SEL of selector 900a is at "H" level, output signal SEL of selector 900b is at "L" level, and output signal SEL of selector 900c is at "L" level, delay circuit 850 uses a signal route R7 passing through only delay unit 830a as shown in FIG. 12.

According to the second embodiment of the invention, by switching a signal route passing through a delay stage in accordance with the output signal of the selector, a delay time of the refresh timer control circuit of the first embodiment can be varied. Consequently, refresh clock signal RCLK with higher accuracy can be transmitted to another circuit.

Third Embodiment

Figure 13:
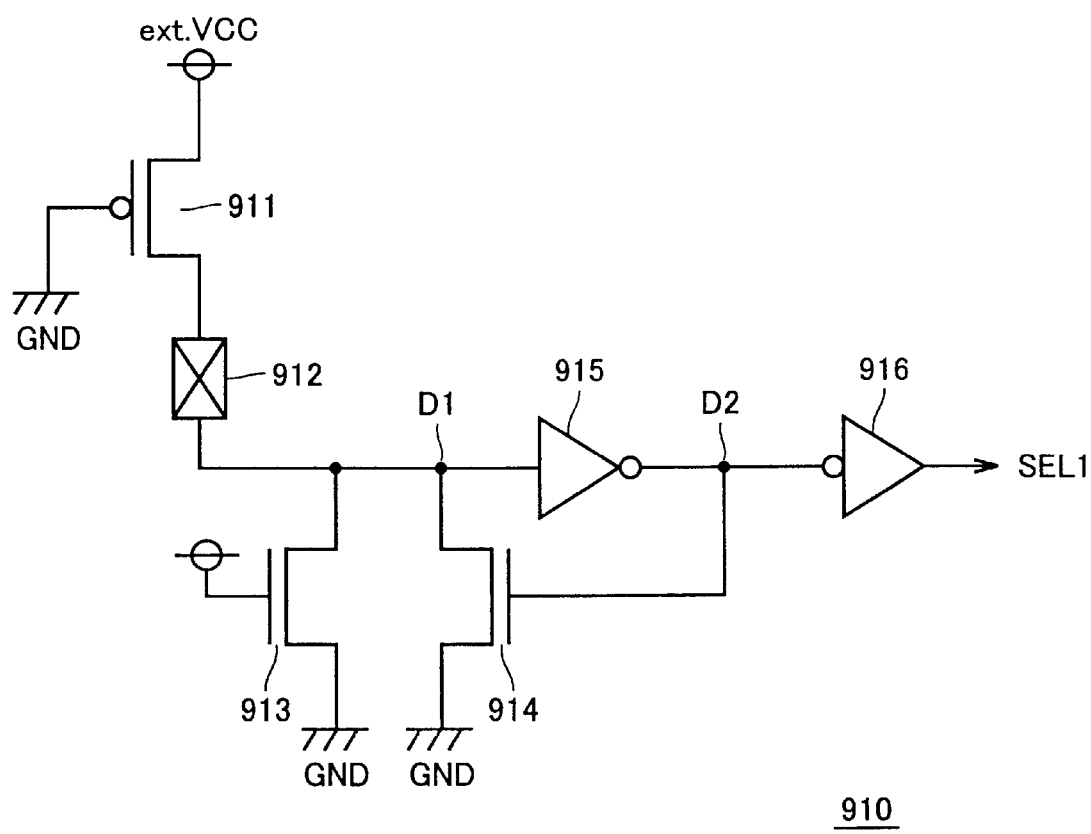
FIG. 13 is a diagram showing a selector 910 of a third embodiment of the invention.

Referring to FIG. 13, a selector 910 is an example of selector circuit 900 of the second embodiment of the invention and is a circuit for switching a signal route passing through a delay stage by changing the level of output signal SEL by blowing a fuse.

Selector 910 has a P-channel MOS transistor 911, a fuse 912, N-channel MOS transistors 913 and 914, and inverters 915 and 916.

P-channel MOS transistor 911 and fuse 912 are connected in series between external source voltage ext.VCC and a node D1. The gate electrode of P-channel MOS transistor 911 is connected to ground voltage GND.

N-channel MOS transistor 913 is connected between ground voltage GND and node D1. The gate electrode is connected to external source voltage ext.VCC.

N-channel MOS transistor 914 is connected between ground voltage GND and node D1. The gate electrode is connected to a node D2.

Inverter 915 inverts a signal transmitted to node D1 and outputs the inverted signal to node D2.

Inverter 916 inverts a signal transmitted to node D2 and outputs inverted signal SEL1.

The operation of selector 910 will be described.

It is assumed that a driving force of P-channel MOS transistor 911 is stronger than that of N-channel MOS transistor 913.

In case where fuse 912 is not brown, therefore, since the driving force of P-channel MOS transistor 911 is stronger than that of N-channel MOS transistor 913, node D1 goes high ("H" level).

Output signal SEL1 of selector 910 consequently goes high ("H" level) via inverters 915 and 916.

On the other hand, when fuse 912 is blown, since N-channel MOS transistor 913 is turned on, node D1 is at "L" level.

By inverter 915, node D2 goes high ("H" level).

Since N-channel MOS transistor 914 is turned on, node D2 is therefore latched at "H" level, and output signal SEL1 of selector 910 goes low via inverter 916.

By using selector 910 of the third embodiment of the invention, although a signal route passing through a delay stage has to be designed in a wafer manufacturing process in delay circuit 710 of the second embodiment, a delay stage can be changed after manufacturing the wafer.

Figure 14:
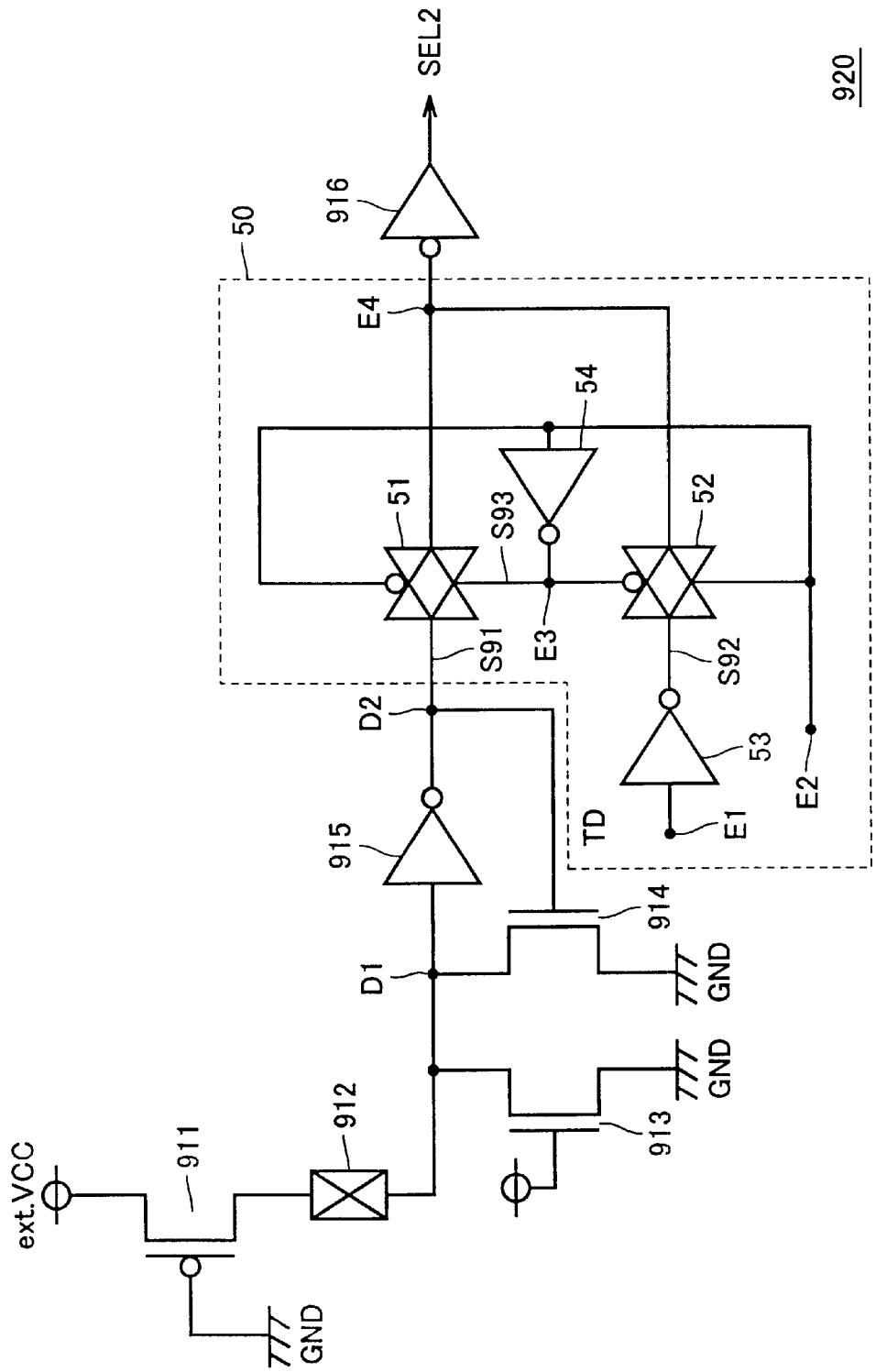
FIG. 14 is a diagram showing a selector 920 as another example of selector 910.

FIG. 14 is a diagram showing a selector 920 as another example of selector 910.

Selector 920 can recognize a simulated operation by switching a test signal in a test mode before a signal route passing through a delay stage is switched by blowing a fuse.

Selector 920 is obtained by adding a test circuit 50 to the configuration of selector 910, and test circuit 50 is connected between node D2 and inverter 916.

Test circuit 50 has transmission gates 51 and 52 and inverters 53 and 54.

Transmission gate 51 is connected between node D2 and a node E4.

Transmission gates 51 and 52 operate according to the signal level of a node E2.

Inverter 54 inverts a signal input to node E2 and outputs the inverted signal to a node E3.

Node E4 supplies a signal to the input node of inverter 916.

Inverter 53 and transmission gate 52 are connected in series between a node E1 and node E4.

Figure 15:
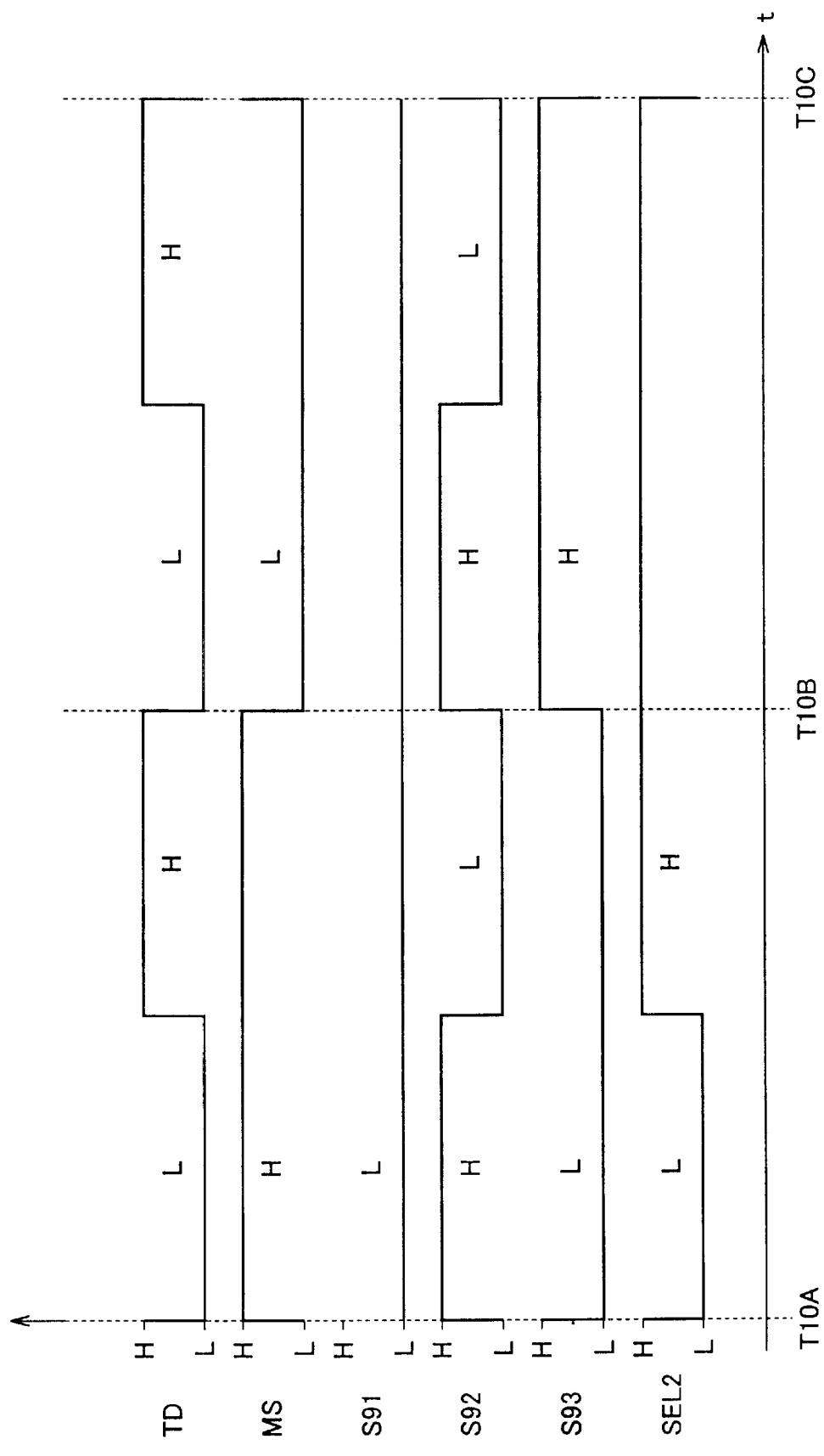
FIG. 15 is a diagram showing operation waveforms of selector 920.

FIG. 15 is a diagram showing operation waveforms of selector 920.

In a period from T10A to T10B, operations in the test mode are shown. In a period from T10B to T10C, operations in a normal mode are shown.

In the case of the test mode, it is assumed that a mode selector signal MS input to node E2 is at "H" level. Transmission gate 51 is consequently turned off, and an input signal (S91) of node D2 is not transmitted to the input side of inverter 916.

However, transmission gate 52 is turned on, so that a test data signal TD from node E1 can be transmitted to the input side of inverter 916.

For example, when test data signal TD is set at "H" level, the output node of selector 920 goes high via inverters 53 and 916. When test data signal TD is set to "L" level, the output node of selector 920 becomes at "L" level.

On the other hand, in the normal mode, mode selector signal MS input to node E2 is set to "L" level. Transmission gate 51 is consequently turned on and transmission gate 52 is turned off. Therefore, an input signal (S91) from node D3 is transmitted as it is to the input side of inverter 916.

Different from selector 910, first, selector 920 can conduct a test for switching a delay stage by using test circuit 50. After actually conducting the test, whether a fuse is brown or not can be determined.

As a result, a delay route having higher accuracy as compared with the case using selector 910 can be designed.

Figure 16:
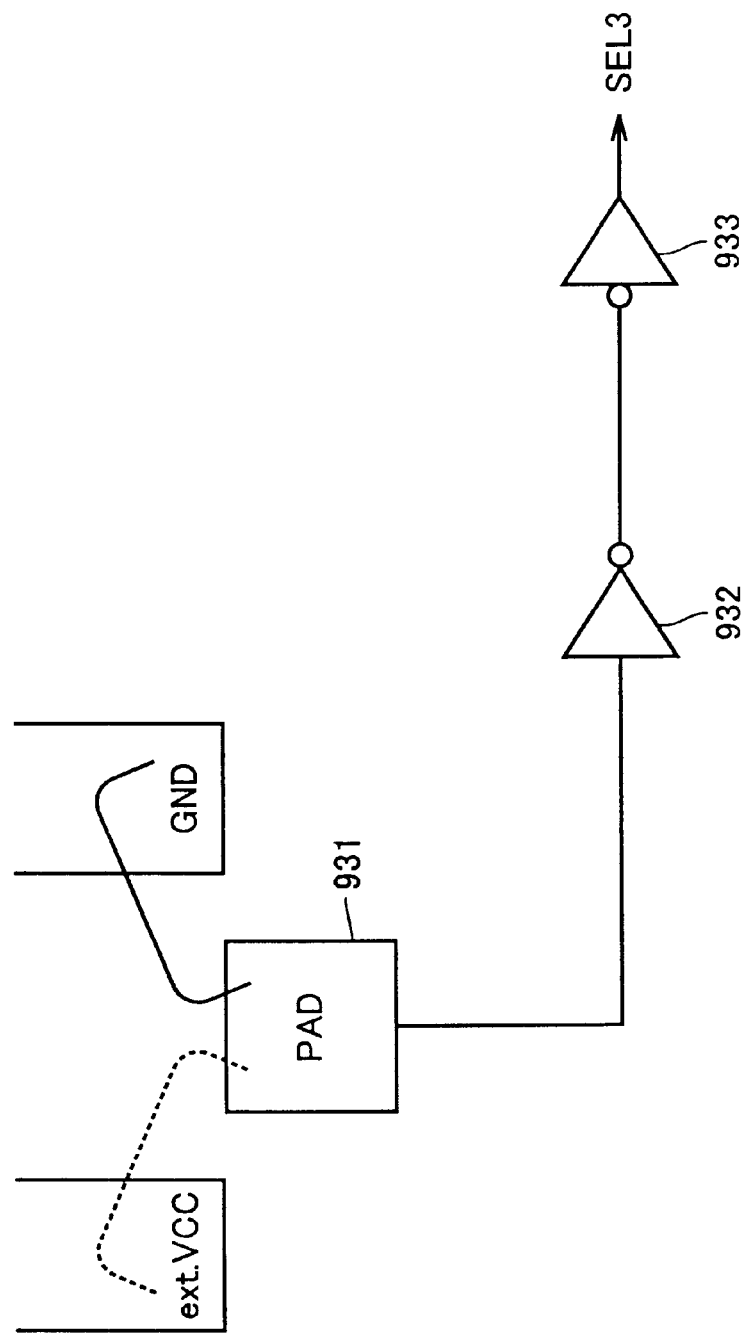
FIG. 16 is a diagram showing a selector 930 as an example of selector 900.

Referring to FIG. 16, a selector 930 can generate a selector signal SEL3 input from an external pad.

Selector 930 has an external pad 931 and inverters 932 and 933.

By wire bonding external pad 931 to external source voltage ext.VCC ("H" level) or ground voltage GND ("L" level), output SEL3 of selector 930 can be switched.

Figure 17:
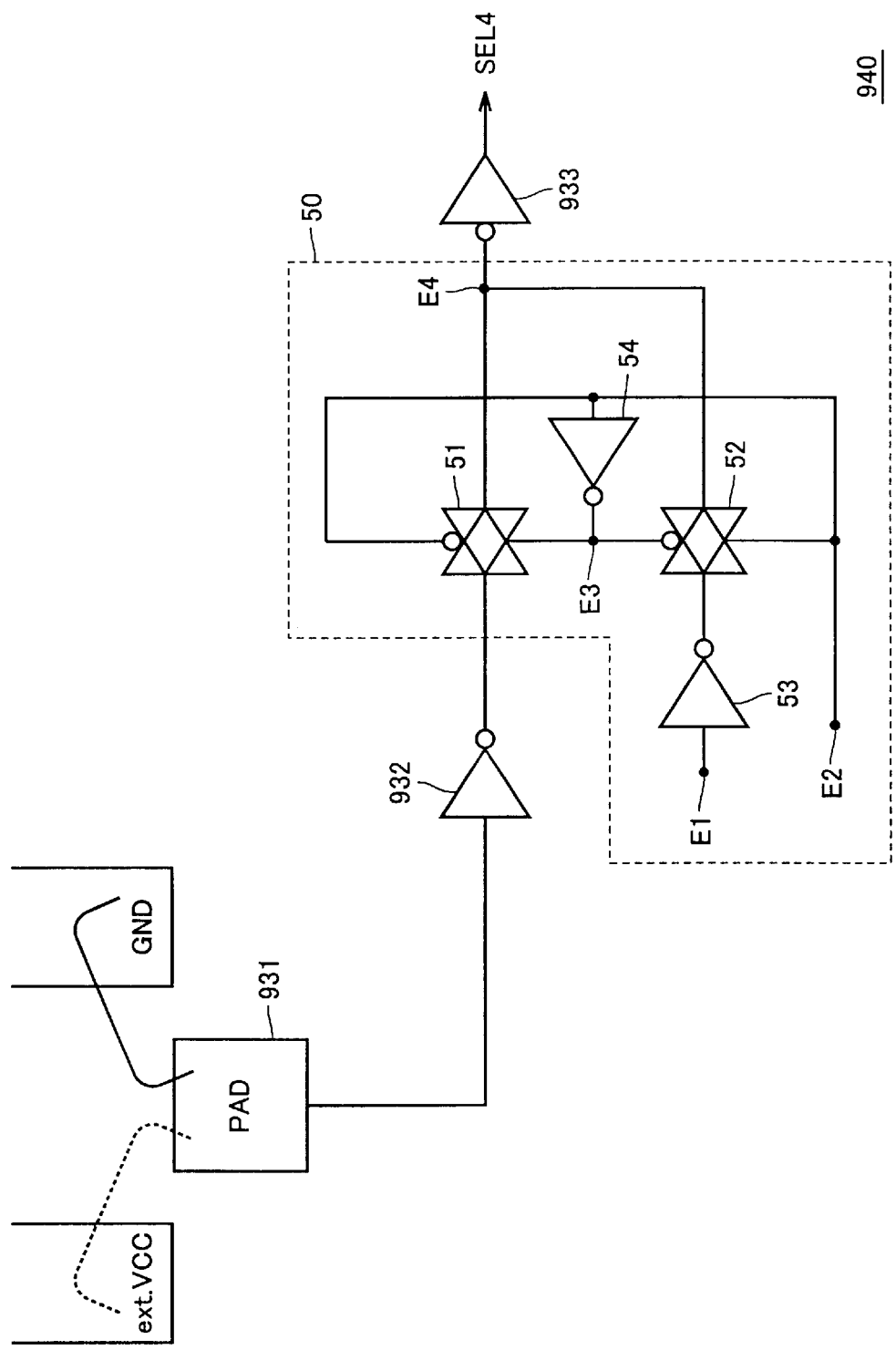
FIG. 17 is a diagram showing a selector 940 as an other example of selector 930.

FIG. 17 shows a selector 940 as another construction example of selector 930.

In a test mode before performing wire bonding to external pad 931, a simulated operation can be recognized by switching a test signal. Consequently, an output signal SEL4 of selector 940 can be generated.

In selector 940, test circuit 50 is connected between inverters 932 and 933.

As the connection relation and operation of selector 940 are similar to those described above, their detailed description will not be repeated.

Figure 18:
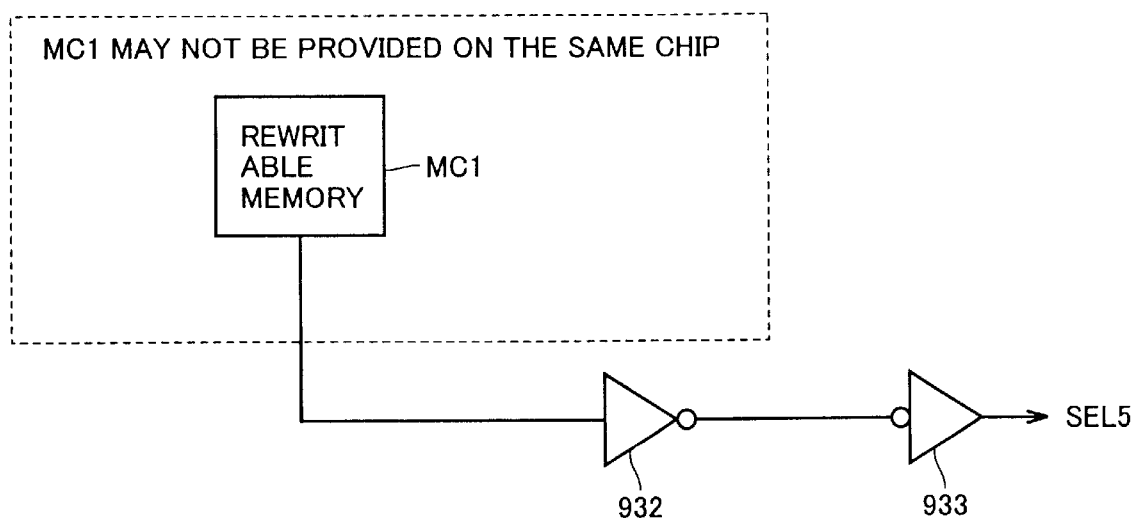
FIG. 18 is a diagram showing a selector 950 as a modification of selector 930.

FIG. 18 shows a selector 950 as a modification of selector 930.

Selector 950 can switch a selector output SEL5 by writing or erasing data to/from a rewritable memory MC1.

Selector 950 is obtained by replacing external pad 931 of selector 930 with memory MC1.

When data is written to memory MC1, selector output SEL5 goes high. When the data in memory MC1 is erased, selector output SEL5 goes low.

By using memory MC1, therefore, the selector output can be easily switched.

It is assumed that a memory in the semiconductor memory device of the invention is used as memory MC1. The invention is not limited to the memory but it is also possible to use a memory formed on another chip.

Fourth Embodiment

Figure 19:
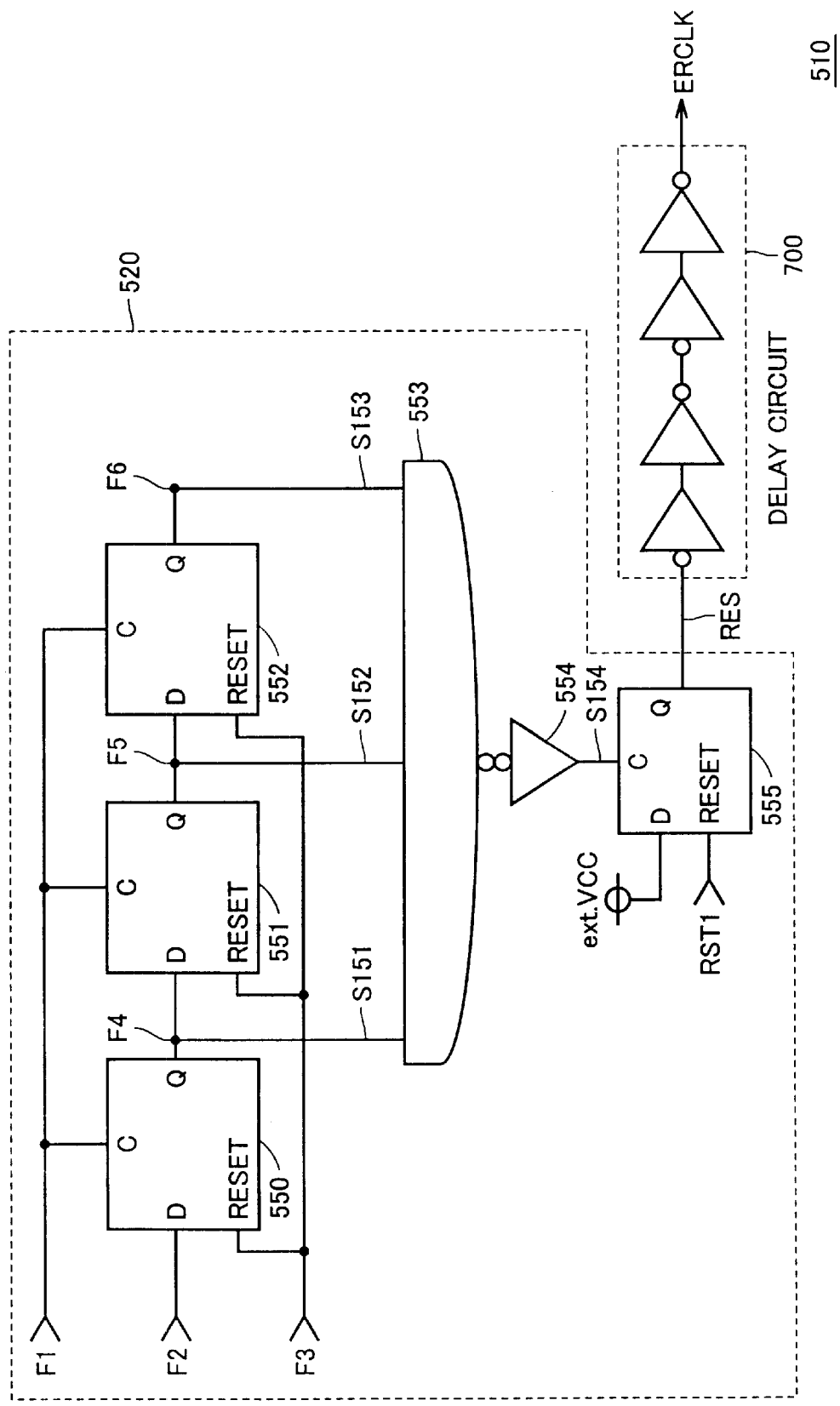
FIG. 19 is a diagram showing the configuration of a refresh timer control circuit 510 which can be replaced by refresh timer control circuit 500 in the first embodiment of the invention.

Referring to FIG. 19, when a refresh timer control circuit 510 enters a predetermined state by a combination of external input signals, refresh timer control circuit 510 generates refresh timer control signal ERCLK to control refresh clock signal RCLK as an output signal of refresh timer 100.

Refresh timer control circuit 500 according to the first embodiment can be replaced by refresh time control circuit 510.

Refresh timer control circuit 510 has a refresh status generating circuit 520 and a delay circuit 700.

Refresh status generating circuit 520 has register circuits 550 to 552 connected in series, a register circuit 555, a NAND circuit 553, and an inverter 554.

Register circuits 550 to 552 are conventional D flip flops, and internal nodes F4 to F6 for receiving output signals of register circuits 550 to 552, respectively, are connected to the input side of NAND circuit 553. An input node F1 is connected to an activate signal input side of each of register circuits 550 to 552. An input node F2 is connected to the input side of register circuit 550. An input node F3 is connected to the input side of a reset signal of each of register circuits 550 to 552.

Register 555 is a D flip flop, activated by an output signal of inverter 554, and outputs the voltage level of external source voltage ext.VCC as an input signal as a refresh status control signal RES.

Since delay circuit 700 is similar to the above-described delay circuit, its detailed description will not be repeated.

Figure 20:
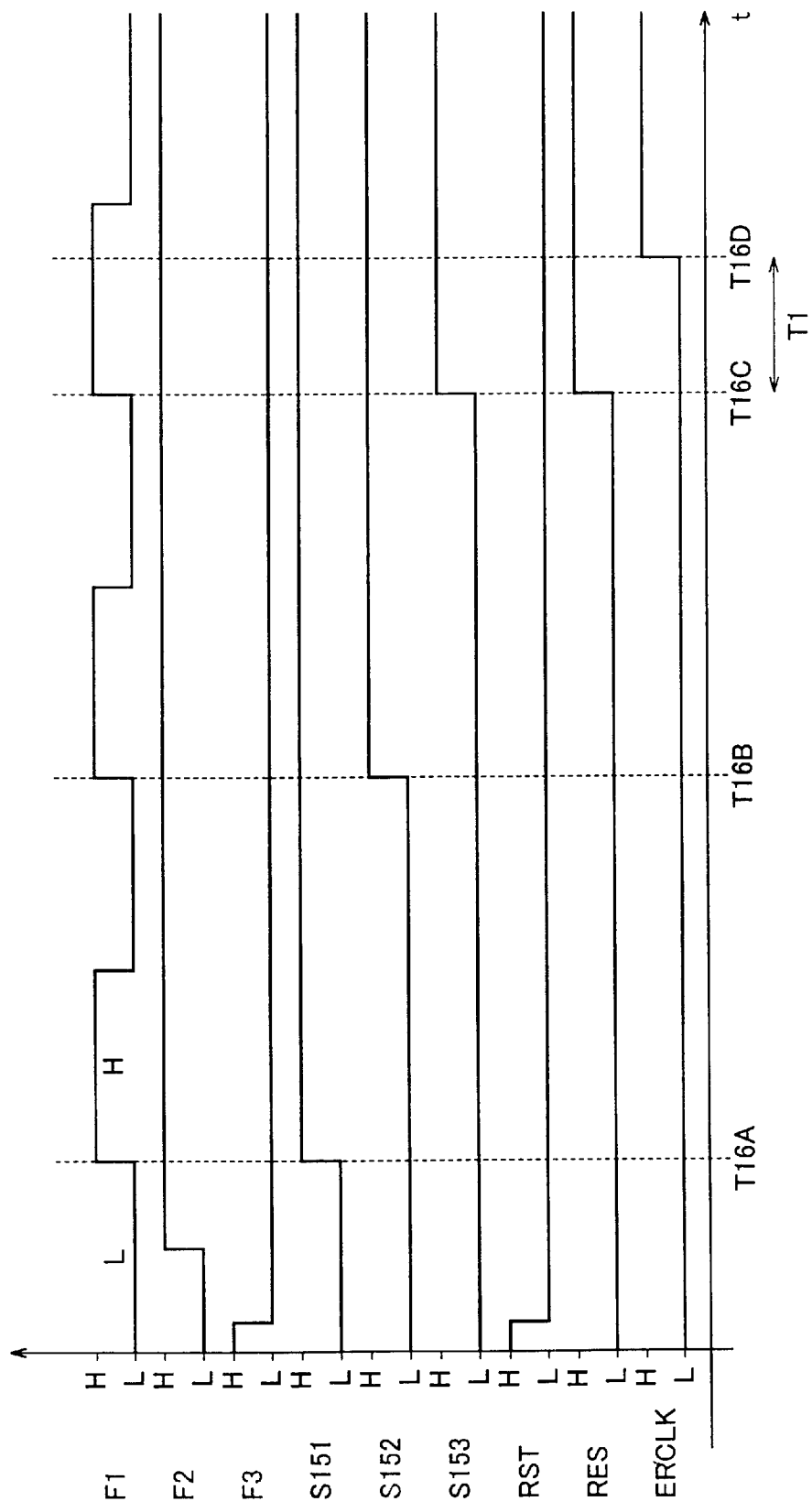
FIG. 20 is a time chart of refresh timer control circuit 510.
Figure 21:
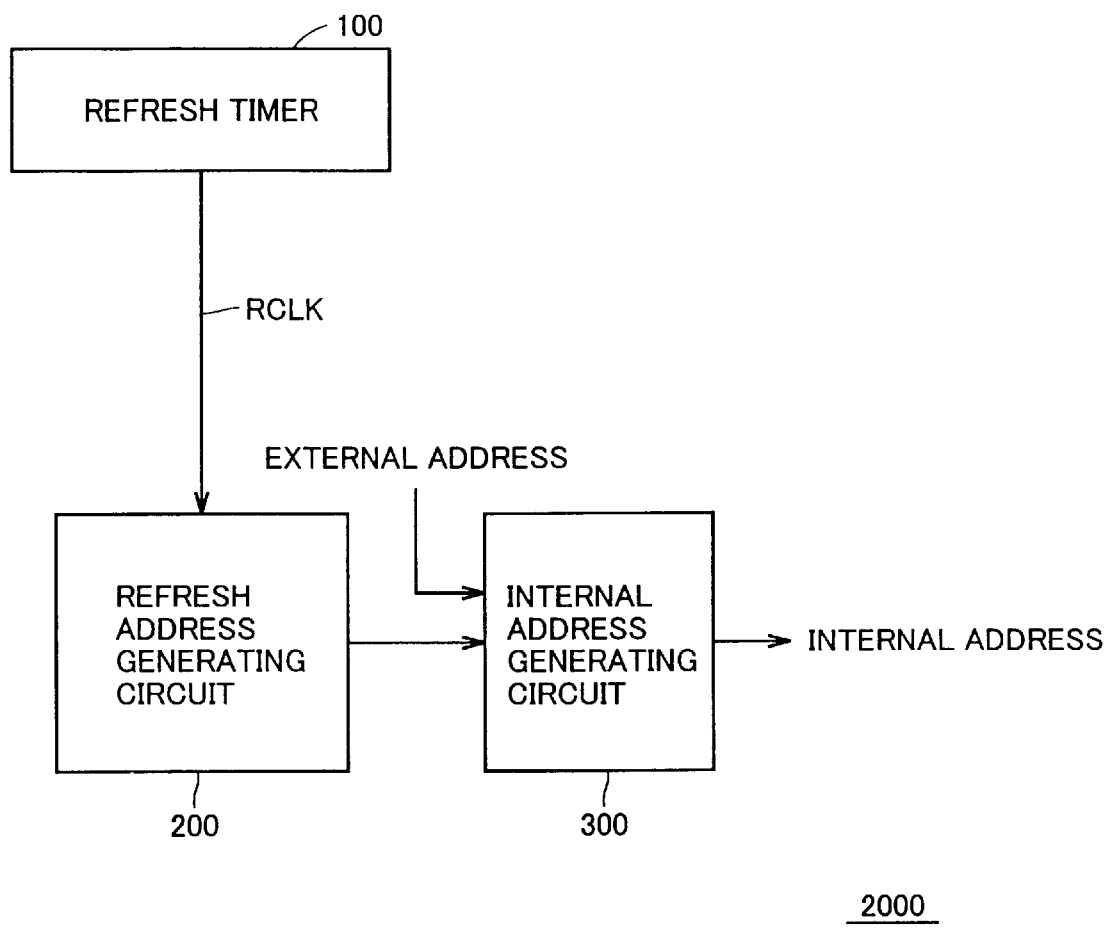
FIG. 21 is a block diagram of a row selection control circuit 2000 for performing a conventional refreshing control included in a row decoder.

FIG. 20 is a time chart of refresh timer control circuit 510.

In the embodiment, when all the outputs of registers 550 to 552 go high, the output of the refresh timer is transmitted to another circuit.

When a pulse signal is applied from input node F1 and a signal of "H" level is input from input node F2, registers 550 to 552 sequentially go high and outputs S151, S152, and S153 of the registers go high. When all of outputs S151, S152, and S153 go high, an output S154 goes high.

When output S154 goes high, register 555 is activated, and refresh status control signal RES goes high. After delaying a predetermined time by delay circuit 700, refresh timer control signal ERCLK is outputted.

When the internal nodes are in a predetermined combination by refresh timer control circuit 510 in the fourth embodiment of the invention, for example, when all the internal nodes become at "H" level, refresh timer control signal ERCLK is outputted. In accordance with this, refresh clock signal RCLK as an output signal of refresh timer 100 is transmitted to refresh address generating circuit 200.

With the configuration in which refresh timer control signal ERCLK is generated according to a plurality of combinations of internal nodes by the plurality of signal inputs like in refresh timer control circuit 510 of the fourth embodiment of the invention, occurrence of an erroneous operation can be prevented, and the noise-immune refresh time control circuit can be designed.

The invention can be also applied to a circuit configuration simplified by providing a pin dedicated to an external input signal which is not used in a normal operation and generating refresh timer control signal ERCLK in accordance with the external input signal.

With the configuration of using a plurality of signals used in the normal operation and generating refresh timer control signal ERCLK in accordance with the plurality of input signals, occurrence of an erroneous operation can be prevented.

By using one combination of the internal nodes, the number of logic circuits such as flip flops can be reduced, and the number of components of the circuit can be accordingly reduced.

As delay circuit 700 in refresh timer control circuit 510 in the fourth embodiment of the invention, the delay circuit and the selector described in the second and third embodiments can be applied.

Although the invention has been described with respect to DRAM with the complete hidden refreshing function, the invention can be also applied to a general DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array having a plurality of memory cells arranged in a matrix;
   a refresh timer for generating a refresh clock having a predetermined refresh cycle;
   a refresh executing circuit for sequentially refreshing said plurality of memory cells part by part on the basis of the cycle of said refresh clock; and
   a refreshing control circuit disposed between said refresh timer and said refresh executing circuit, for stopping transmission of said refresh clock from said refresh timer to said refresh executing circuit in a predetermined period in which the cycle of said refresh clock is unstable.

2. The semiconductor memory device according to claim 1, wherein said refreshing control circuit sets a period which is a predetermined time elapsed since an operation source voltage of said refresh timer is started to be applied as said predetermined period.

3. The semiconductor memory device according to claim 2, wherein said refreshing control circuit includes:
   a first power-on reset circuit for generating a first initialization control signal which is activated when said operation source voltage exceeds a first threshold voltage at power-on;
   a delay circuit for delaying said first initialization control signal from said power-on reset circuit; and
   a logic circuit for forcedly fixing a signal level of said refresh clock until the first initialization control signal delayed by said delay circuit is activated.

4. The semiconductor memory device according to claim 3,
   further comprising an internal circuit whose circuit state is initialized at said power-on,
   wherein initialization of said circuit state in said internal circuit is executed on the basis of said first initialization control signal from said first power-on reset circuit.

5. The semiconductor memory device according to claim 3, further comprising:
   a second power-on reset circuit for generating a second initialization control signal which is activated when said operation source voltage exceeds a second threshold voltage at said power-on; and an internal circuit whose circuit state is initialized in response to said second initialization control signal.

6. The semiconductor memory device according to claim 3, wherein said delay circuit has:
   a plurality of signal routes arranged in parallel and having different signal propagation times; and
   a selection circuit for transmitting said first initialization control signal to one of said plurality of signal routes.

7. The semiconductor memory device according to claim 6, wherein said selection circuit has a distribution switch selectively formed between a node to which said first initialization control signal is transmitted and said plurality of signal routes.

8. The semiconductor memory device according to claim 6, wherein said selection circuit has a fuse element which can be blown from the outside,
   said selection circuit generates a selection signal having a signal level according to whether said fuse element is blown or not, and
   said selection circuit further has a signal transmission gate for selectively transmitting said first initialization control signal to one of said plurality of signal routes in accordance with said selection signal.

9. The semiconductor memory device according to claim 8, wherein said selection circuit further has a test circuit for generating said selection signal in accordance with a test signal input from the outside in a test mode irrespective of whether said fuse element is blown or not.

10. The semiconductor memory device according to claim 6, wherein said selection circuit has a pad electrically coupled to one of a plurality of voltages,
    said selection circuit generates a selection signal having a signal level according to a voltage of said pad, and
    said selection circuit further has a signal transmission gate for selectively transmitting said first initialization control signal to one of said plurality of signal routes in accordance with said selection signal.

11. The semiconductor memory device according to claim 10, wherein said selection circuit further has a test circuit for generating said selection signal in accordance with a test signal input from the outside in a test mode irrespective of the voltage of said pad.

12. The semiconductor memory device according to claim 6, wherein said selection circuit has a rewritable memory circuit for holding data,
    said selection circuit generates a selection signal having a signal level according to said data read from said memory circuit, and
    said selection circuit further has a signal transmission gate for selectively transmitting said first initialization control signal to one of said plurality of signal routes in accordance with said selection signal.

13. The semiconductor memory device according to claim 6, wherein said semiconductor memory device is mounted on one of a plurality of chips sealed in the same package,
    said selection circuit generates a selection signal having a signal level according to said data input from a data-rewritable memory circuit formed in another one of said plurality of chips, and
    said selection circuit further has a signal transmission gate for transmitting said first initialization control signal to one of said plurality of signal routes in accordance with said selection signal.

14. The semiconductor memory device according to claim 1, wherein said refreshing control circuit sets, as said predetermined period, a period of a predetermined time elapsed since a timing at which a predetermined control signal input from the outside is set in a predetermined state.

15. The semiconductor memory device according to claim 14, wherein said refreshing control circuit includes:
    a signal generating circuit for generating a refresh status control signal which is activated when said predetermined control signal enters said predetermined status;
    a delay circuit for delaying said refresh status control signal from said signal generating circuit; and
    a logic circuit for forcedly fixing a signal level of said refresh clock until the refresh status control signal delayed by said delay circuit is activated.

16. The semiconductor memory device according to claim 14, wherein said predetermined control signal is a single signal, and
    said predetermined control signal is not used in a normal operation of said semiconductor memory device.

17. The semiconductor memory device according to claim 16, wherein said refreshing control circuit starts said predetermined period when said predetermined control signal maintains said predetermined status for a predetermined time.

18. The semiconductor memory device according to claim 14, wherein said predetermined control signal includes a plurality of signals used in a normal operation of said semiconductor memory device, and
    said predetermined status corresponds to a predetermined combination of signal levels of said plurality of signals.

19. The semiconductor memory device according to claim 18, wherein said refreshing control circuit starts said predetermined period when said predetermined control signal maintains said predetermined status for a predetermined time.

* * * * *